(12) United States Patent
Kim et al.

(10) Patent No.: US 8,050,074 B2
(45) Date of Patent: Nov. 1, 2011

(54) MAGNETIC PACKET MEMORY STORAGE DEVICES, MEMORY SYSTEMS INCLUDING SUCH DEVICES, AND METHODS OF CONTROLLING SUCH DEVICES

(75) Inventors: Ho-jung Kim, Suwon-si (KR);
Chul-woo Park, Yongin-si (KR);
Sang-beom Kang, Hwaseong-si (KR);
Jong-wan Kim, Seongnam-si (KR);
Hyun-ho Choi, Suwon-si (KR);
Young-pil Kim, Hwaseong-si (KR);
Sung-chul Lee, Osan-si (KR)

(73) Assignee: Samsung Electronics Co., Ltd. (KR)

(*) Notice: Subject to any disclaimer, the term of this patent is extended or adjusted under 35 U.S.C. 154(b) by 131 days.

(21) Appl. No.: 12/658,807

(22) Filed: Feb. 16, 2010

(65) Prior Publication Data

US 2010/0208381 A1 Aug. 19, 2010

(30) Foreign Application Priority Data

Feb. 17, 2009 (KR) .................. 10-2009-0013130
Feb. 17, 2009 (KR) .................. 10-2009-0013138

(51) Int. Cl.
*G11C 19/00* (2006.01)

(52) U.S. Cl. ............. 365/80; 365/158; 365/173

(58) Field of Classification Search ........ 365/80, 365/158, 173
See application file for complete search history.

(56) References Cited

U.S. PATENT DOCUMENTS

| | | | |
|---|---|---|---|
| 6,781,871 B2 | 8/2004 | Park et al. | |
| 6,834,005 B1 | 12/2004 | Parkin | |
| 6,849,891 B1 | 2/2005 | Hsu et al. | |
| 6,898,132 B2 | 5/2005 | Parkin | |
| 6,920,062 B2 | 7/2005 | Parkin | |
| 6,955,926 B2 | 10/2005 | Chen et al. | |
| 6,970,379 B2 | 11/2005 | Parkin | |
| 7,009,872 B2 * | 3/2006 | Alva ............... | 365/158 |
| 7,031,178 B2 | 4/2006 | Parkin | |
| 7,108,797 B2 | 9/2006 | Chen et al. | |
| 7,218,556 B2 | 5/2007 | Kim et al. | |
| 7,236,386 B2 | 6/2007 | Parkin | |
| 7,242,604 B2 | 7/2007 | Klaeui et al. | |
| 7,282,759 B2 | 10/2007 | Kim et al. | |
| 7,315,470 B2 | 1/2008 | Parkin | |
| 7,477,539 B2 | 1/2009 | Kim et al. | |
| 2007/0133251 A1 * | 6/2007 | Carey et al. ........ | 365/129 |
| 2007/0158736 A1 | 7/2007 | Arai et al. | |
| 2007/0194359 A1 | 8/2007 | Lim et al. | |
| 2007/0195587 A1 | 8/2007 | Kim et al. | |
| 2007/0195588 A1 | 8/2007 | Kim et al. | |

(Continued)

*Primary Examiner* — Tuan T. Nguyen

(74) *Attorney, Agent, or Firm* — Onello & Mello LLP

(57) ABSTRACT

A memory device is comprised of a magnetic structure that stores information in a plurality of domains of the magnetic structure. A write unit writes information to at least one of the plurality of domains of the magnetic structure by applying a write current to the magnetic structure in response to a control signal. A read unit reads information from at least one of the plurality of domains of the magnetic structure by applying a read current to the magnetic structure in response to the control signal. A domain wall movement control unit is coupled to a portion of the magnetic structure and moves information stored in the plurality of domains in the magnetic structure to other domains in the magnetic structure in response to the control signal. The write unit, the read unit and the domain wall movement control unit are all coupled to the same control signal line that provides the control signal.

21 Claims, 28 Drawing Sheets

U.S. PATENT DOCUMENTS

| | | |
|---|---|---|
| 2007/0198618 A1 | 8/2007 | Kim et al. |
| 2008/0025060 A1 | 1/2008 | Lim et al. |
| 2008/0068880 A1 | 3/2008 | Lim et al. |
| 2008/0068881 A1 | 3/2008 | Lim et al. |
| 2008/0068936 A1 | 3/2008 | Lim et al. |
| 2008/0080092 A1 | 4/2008 | Kim |
| 2008/0094760 A1 | 4/2008 | Lee et al. |
| 2008/0094887 A1 | 4/2008 | Hwang et al. |
| 2008/0100963 A1 | 5/2008 | Lee et al. |
| 2008/0124578 A1 | 5/2008 | Kim et al. |
| 2008/0137389 A1 | 6/2008 | Hwang et al. |
| 2008/0137395 A1 | 6/2008 | Hwang et al. |
| 2008/0137406 A1 | 6/2008 | Lim et al. |
| 2008/0137521 A1 | 6/2008 | Lee et al. |
| 2008/0138659 A1 | 6/2008 | Lim et al. |
| 2008/0138661 A1 | 6/2008 | Lim et al. |
| 2008/0152794 A1 | 6/2008 | Lim et al. |
| 2008/0152953 A1 | 6/2008 | Lim |
| 2008/0152954 A1 | 6/2008 | Lim |
| 2008/0158710 A1 | 7/2008 | Lim |
| 2008/0160349 A1 | 7/2008 | Lim |
| 2008/0173932 A1 | 7/2008 | Kidoh et al. |
| 2009/0040883 A1 | 2/2009 | Kim et al. |

* cited by examiner

MAGNETIC PACKET MEMORY STORAGE DEVICES, MEMORY SYSTEMS INCLUDING SUCH DEVICES, AND METHODS OF CONTROLLING SUCH DEVICES

RELATED APPLICATIONS

This application claims priority under 35 U.S.C. 119 to Korean Patent Application No. 10-2009-0013130, filed on Feb. 17, 2009, and Korean Patent Application No. 10-2009-0013138, filed on Feb. 17, 2009, the content of each being incorporated herein by reference in its entirety.

BACKGROUND

With the continued emphasis on highly integrated electronic devices, there is an ongoing need for semiconductor memory devices that operate at higher speed and lower power and that have increased device density. To accomplish this, devices with aggressive scaling and multiple-layered devices with transistor cells arranged in horizontal and vertical arrays have been under development.

In recent years, there has been development in the field of magnetic packet memory storage devices. In such devices, a magnetic structure, or "magnetic track", is defined to include a series of physical domain regions. The magnetic structure is formed, for example, of ferromagnetic material so that it can store data in the form of magnetic fields having predefined orientations. Such devices are generally experimental in nature.

SUMMARY

Embodiments of the present invention are directed to memory storage devices and systems containing such devices whereby information is stored in the form of magnetic packets. In particular magnetic memory storage devices and systems are provided including a write unit, a read unit and domain wall movement control unit for storing information and retrieving the stored information in response to a control signal. In one embodiment, the write unit, read unit and domain wall movement control unit are all coupled to the same control signal line that provides the control signal. In this manner, a magnetic memory storage device and system are provided that have a configuration that is practical for device integration on a large scale. Further, embodiments are further directed to methods of controlling such devices and systems.

In one aspect, a memory device, comprises: a magnetic structure that stores information in a plurality of domains of the magnetic structure; a write unit that writes information to at least one of the plurality of domains of the magnetic structure by applying a write current to the magnetic structure in response to a control signal; a read unit that reads information from at least one of the plurality of domains of the magnetic structure by applying a read current to the magnetic structure in response to the control signal; and a domain wall movement control unit coupled to a portion of the magnetic structure that moves information stored in the plurality of domains in the magnetic structure to other domains in the magnetic structure in response to the control signal. The write unit, the read unit and the domain wall movement control unit are all coupled to the same control signal line that provides the control signal.

In one embodiment, the write unit comprises at least one write control switch that controls the application of a write current to the at least one of a plurality of domains of the magnetic structure in response to the control signal, and a gate of the at least one write control switch is coupled to the control signal line.

In another embodiment, the read unit comprises at least one read control switch that controls the application of a read current to the at least one of a plurality of domains of the magnetic structure in response to the control signal, and a gate of the at least one read control switch is coupled to the control signal line.

In another embodiment, the domain wall movement control unit comprises at least one domain wall movement control switch that controls the application of a domain wall movement current to the magnetic structure in response to the control signal, and a gate of the domain wall movement control switch is coupled to the control signal line.

In another embodiment, the at least one domain wall movement unit is connected to first and second portions of the magnetic structure that are spaced apart from each other so that the domain wall current is applied through the magnetic structure in response to the control signal.

In another embodiment, the at least one domain wall movement unit comprises at least one domain wall movement control switch that is connected to one of the first and second portions of the magnetic structure and the other of the first and second portion of the magnetic structure is directly connected to a potential supply.

In another embodiment, the at least one domain wall movement unit comprises first and second domain wall movement control switches that are respectively connected to the first and second portions of the magnetic structure.

In another embodiment, the write unit and read unit are coupled to portions of the magnetic structure that are spaced apart from each other so that they write information to and read information from respectively different domains of the plurality of domains of the magnetic structure.

In another embodiment, the write unit and read unit are coupled to portions of the magnetic structure that are at opposite ends of the magnetic structure.

In another embodiment, the write unit and read unit are coupled to portions of the magnetic structure that are the same so that they write information to and read information from a same domain of the plurality of domains of the magnetic structure.

In another embodiment, the portions of the magnetic structure to which the write unit and read unit are coupled are at a central region of magnetic structure.

In another aspect, a memory device comprises: a memory decoder that generates a plurality of select signals in response to command and address signals received from a memory controller and that applies the select signals to selected signal lines; a domain wall movement current generator that applies a domain wall movement current to a domain wall movement current signal line; a write current generator that applies a write current to a write current signal line; a read current generator that applies a read current to a read current signal line; and a plurality of storage units. Each storage unit comprises: a magnetic structure that stores information in a plurality of domains of the magnetic structure; a write unit that writes information to at least one of the plurality of domains of the magnetic structure by applying the write current to the magnetic structure in response to the select signal on the corresponding selected signal line; a read unit that reads information from at least one of the plurality of domains of the magnetic structure by applying a read current to the magnetic structure in response to the select signal on the corresponding selected signal line; and a domain wall movement control unit coupled to a portion of the magnetic structure that moves information stored in the plurality of domains in the magnetic structure to other domains in the magnetic structure in response to the select signal on the corresponding selected signal line.

In one embodiment, the write unit, the read unit and the domain wall movement control unit of each storage unit are all coupled to the same select signal line that provides the select signal.

In another embodiment: each storage unit selectively receives one of the plurality of select signals from the memory decoder on a corresponding one of the select signal lines; each storage unit selectively receives the domain wall movement current on the domain wall movement current signal line; each storage unit selectively receives the write current on the write current signal line; and each storage unit selectively receives the read current on the read current signal line.

In another embodiment, the domain wall movement current generator is directly coupled to at least one end of the magnetic structure of a plurality of the storage units.

In another embodiment, the select signal lines extend in a first horizontal direction and the domain wall movement current signal line extends in a second horizontal direction that is transverse the first horizontal direction.

In another embodiment, the select signal lines and the domain wall movement current signal line are spaced apart from each other in a vertical direction.

In another embodiment, the memory device is incorporated into a memory system, the memory system further comprising: a memory controller that generates command and address signals; and a memory module comprising a plurality of the memory devices, the memory module receiving the command and address signals and in response storing and retrieving data to and from at least one of the memory devices.

In another aspect, a multiple-layered memory device comprises: a plurality of storage units on first and second layers of the memory device, each storage unit comprising: a magnetic structure that stores information in a plurality of domains of the magnetic structure; a write unit that writes information to at least one of the plurality of domains of the magnetic structure by applying the write current to the magnetic structure in response to the select signal on the corresponding select signal line; a read unit that reads information from at least one of the plurality of domains of the magnetic structure by applying a read current to the magnetic structure in response to the select signal on the corresponding select signal line; and a domain wall movement control unit coupled to a portion of the magnetic structure that moves information stored in the plurality of domains in the magnetic structure to other domains in the magnetic structure in response to the select signal on the corresponding select signal line; wherein the write unit, the read unit and the domain wall movement control unit are all coupled to the same select signal line that provides the select signal; and wherein the magnetic structures of the storage units on the first layer of the memory device are oriented to extend in a first horizontal direction, and wherein the magnetic structures of the storage units on the second layer of the memory device are oriented to extend in a second horizontal direction, the second horizontal direction being transverse the first horizontal direction.

In one embodiment, the first horizontal direction and the second horizontal direction are perpendicular.

In another embodiment, the multiple-layered memory device further comprises: a memory decoder that generates a plurality of select signals in response to command and address signals received from a memory controller and that applies the select signals to select signal lines; a domain wall movement current generator that applies a domain wall movement current to a domain wall movement current signal line; a write current generator that applies a write current to a write current signal line; a read current generator that applies a read current to a read current signal line; wherein: each storage unit selectively receives one of the plurality of select signals from the memory decoder on a corresponding one of the select signal lines; each storage unit selectively receives the domain wall movement current on the domain wall movement current signal line; each storage unit selectively receives the write current on the write current signal line; and each storage unit selectively receives the read current on the read current signal line.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Figure 1:
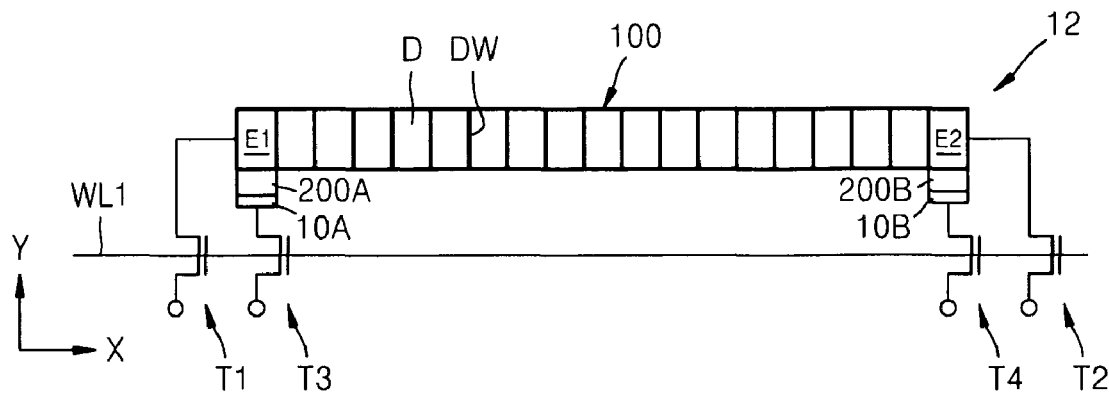
FIG. 1 is a schematic diagram of a magnetic track storage device, in accordance with an embodiment of the present invention.

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap. As mentioned above, the drawings are not necessarily to scale, and while certain features in the drawings appear to have rectangular edges that meet at right angles, those features in fact can be oval, contoured, or rounded in shape in the actual devices.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Magnetic packet memory storage devices, the manufacturing thereof, and the operation thereof are disclosed in: U.S. Pat. No. 6,781,871; U.S. Pat. No. 6,834,005, United States Patent Application Publication 2008/0080092; United States Patent Application Publication 2008/0152794; United States Patent Application Publication 2008/0152953; United States Patent Application Publication 2008/0152954; United States Patent Application Publication 2008/0158710; United States Patent Application Publication 2008/0068880; United States Patent Application Publication 2008/0100963; United States Patent Application Publication 2008/0094760; United States Patent Application Publication 2009/0040883; United States Patent Application Publication 2008/0138659; and United States Patent Application Publication 2008/0137389, the contents of each being incorporated herein by reference.

FIG. 1 is a schematic diagram of a magnetic track storage device, in accordance with an embodiment of the present inventive concept. A magnetic track storage device 12 of FIG. 1 includes a magnetic track 100. In this embodiment, the magnetic track 100 can comprise a strip of ferromagnetic material. In one embodiment, the strip of ferromagnetic material comprises at least one of Co, Ni and Fe.

The magnetic track 100 extends between a first end E1 and a second end E2, and can extend in a straight line, as shown, for example, in a horizontal direction on a surface of a substrate. In other embodiments, the magnetic track can extend on a horizontal surface in two dimensions, such as in a serpentine or meandering arrangement. In other embodiments, the magnetic track can extend in a vertical direction, such as along sidewalls of a trench or raised structure, for example, according to the configurations and embodiments disclosed in U.S. Pat. No. 6,834,005 and United States Patent Application Publication No. 2008/0152794, incorporated herein by reference.

The magnetic track 100 includes a plurality of cells, or domains D, which are defined by domain walls DW. Each domain D is an individually addressable data storage location on the magnetic track 100. In some embodiments, the domains D are defined by a notch, or pinning point, formed in a side edge of the magnetic track 100. Such pinning points are not required in embodiments where a current used to move the domain walls of the track can be precisely controlled. This current is referred to herein as a domain wall moving current, and will be discussed in further detail below.

In the embodiment of FIG. 1, a write unit 200A is positioned at the first end E1 of the magnetic track 100 and a read unit 200B is positioned at the second end E2 of the magnetic track 100. In one embodiment, the write unit 200A comprises a device to which a write current can be applied to write a data element to the first end E1 of the magnetic track 100. The write current is applied to the write unit 200A at lower electrode 10A. In various embodiments, the write unit 200A can comprise a spin transfer torque inducing device, a tunnel magneto resistance device or a giant magneto resistance device. In other embodiments, the write unit 200A can comprise another device suitable for storing data in the form of magnetic information at the domain positioned first end E1 of the magnetic track 100.

The embodiment of FIG. 1 further includes a read unit 200B positioned at the second end E2 of the magnetic track 100. In one embodiment, the read unit 200B comprises a sensing device to which a read current can be applied to read a data element from the second end E2 of the magnetic track 100. The read current is applied to the read unit 200B at lower electrode 10B. In various embodiments, the read unit 200B can comprise a spin transfer torque sensing device, a tunnel magneto resistance sensing device or a giant magneto resistance sensing device. In other embodiments, the read unit 200B can comprise another device suitable for sensing magnetic information occupying the domain positioned at the second end E2 of the magnetic track 100.

A first switching device T1 is coupled to the first end E1 of the magnetic track 100 and a second switching device T2 is coupled to the second end E2 of the magnetic track 100. In one embodiment, the first and second switching devices T1, T2 comprise transistors, and sources or drains of the transistors T1, T2 are connected to the first and second ends E1, E2 of the magnetic track respectively. The other of the sources or drains can be connected to conduction lines of the device. Such conduction lines are referred to in conventional memory devices as bit lines. The first and second switching devices T1, T2 control application of a domain wall moving current through the magnetic track 100. In one embodiment, the domain wall moving current is in the form of a current pulse that is applied though the body of the magnetic track 100 in a direction between the first end E1 and the second end E2 or in a direction between the second end E2 and the first end E1. Application of the domain wall moving current pulse results in a shift in the respective positions of the domains D of the magnetic track. In the present example, a shift will occur either in a left-to-right direction or in a right-to-left direction. In certain embodiments, one of the first and second switching devices, T1, T2 is optional and can be omitted.

A third switching device T3 is coupled to the lower electrode 10A of the write unit 200A. In one embodiment, the third switching device T3 comprises a transistor, and a source or drain of the transistor T3 is connected to the lower electrode 10A. The other of the source or drain can be connected to a conduction line of the device. The third switching device T3 controls application of a write current to the write unit 200A.

A fourth switching device T4 is coupled to the lower electrode 10B of the read unit 200B. In one embodiment, the fourth switching device T4 comprises a transistor, and a source or drain of the transistor T4 is connected to the lower electrode 10B. The other of the source or drain can be connected to a conduction line of the device. The fourth switching device T4 controls application of a read current to the read unit 200B.

During a write operation for writing a data element to the first end E1 of the magnetic track 100, the first switching device T1 and the third switching device T3 are placed in an ON state, for example by closing their respective current paths through the conduction lines to which they are connected, and the second switching device T2 and the fourth switching device T4 are placed in an OFF state, for example by opening their respective current paths of the conduction lines to which they are connected. As a result, a write current flows through the write unit 200A and a data element is written to the first end E1, and the value of the data element, or, in other words, the orientation of the magnetic information placed in the domain D defined at the first end E1, depends on the direction and/or magnitude of the write current flowing through the first and third switching devices T1, T3.

During a read operation for reading a data element from the second end E2 of the magnetic track 100, the first switching device T1 and the third switching device T3 are placed in an OFF state, for example by opening their respective current paths of the conduction lines to which they are connected, and the second switching device T2 and the fourth switching device T4 are placed in an ON state, for example by closing their respective current paths through the conduction lines to which they are connected. As a result, a current flows through the read unit 200B and a data element present at the second end E2 is read. The value of the data element, or, in other words, the orientation of the magnetic information present in the domain D defined at the second end E1, depends on the direction and/or magnitude of the sensed read current flowing through the second and fourth switching devices T2, T4.

Preceding or following both read and write operations, a domain wall moving current is applied to the magnetic track 100. In one example application of a domain wall moving current, the first switching device T1 and second switching device T2 are placed in an ON state, and the third switching device T3 and fourth switching device T4 are placed in an OFF state. As a result, a current is induced through the body of the magnetic track 100, either in a direction from the first end E1 to the second end E2, or in a direction from the second end E2 to the first end E1. This current, referred to herein as a domain wall moving current, operates to shift all positions of the data elements stored in the magnetic track in either a left-to-right direction, or in a right-to-left direction, depending on the orientation of the domain wall moving current. The orientation of the current depends on the relative voltages of the power/current sources to which the first and second switching devices T1, T2 are connected via their respective conduction lines.

For example, in a read operation, a read current can be applied to the read unit 200B to read the data element stored at the domain D associated with that location E2 on the magnetic track 100. To read the value of the next domain on the magnetic track, the read current is removed and a domain wall moving current is applied to move the data elements from a left-to-right direction on the magnetic track. The domain wall moving current operates to shift the next data element of the next domain into position at domain location E2. The domain wall moving current is then removed and the read current is again applied to the read unit 200B to read the next data element. The process continues in this manner, to read all desired data elements from the magnetic track 100. In other words, a read operation is performed according to the following sequence:

Read Operation read current/move current/read current/move current/read current/move current . . .

Similarly, in a write operation, a write current can be applied to the write unit 200A to write a data element to the domain D at location E1 on the magnetic track. To write the value of the next data element on the magnetic track, the write current is removed and a domain wall moving current is applied to move the data elements from a left-to-right direction on the magnetic track. The domain wall moving current operates to shift the previously written data element one position from location E1. The domain wall moving current is then removed and the write current is again applied to the write unit 200A to write the next data element. The process continues in this manner, to write all desired data elements from the magnetic track 100. In other words, a write operation is performed according to the following sequence:

Write Operation write current/move current/write current/move current/write current/move current . . .

In embodiments of the present invention, the switching devices for applying the read current to the read unit, the switching devices for applying the write current to the write unit and the switching devices for applying the domain wall moving current to the magnetic track all receive a control signal from the same control signal line. In the present example, the switching devices for applying the read current to the read unit include transistors T1 and T3, and the gates of these transistors are connected to a same control signal line WL1. Also, the switching devices for applying the write current to the write unit include transistors T2 and T4, and the gates of these transistors are connected to the same control signal line WL1. Also the switching devices for applying the domain wall moving current to the magnetic track include transistors T1 and T2, and the gates of these transistors are likewise connected to the same control signal line WL1. In this example, the control signal line WL1 can comprise a word line of a device that includes the magnetic track storage device 12. In this manner, the resulting circuit size can be reduced, since the transfer gates T1, T2 are connected to the same control line WL1, since both read and write operations are directed by the same control signal line WL1, and since no additional signal buffers are needed. Also, under the present configuration, a read operation and a write operation can be performed on the same magnetic track simultaneously.

Figure 2:
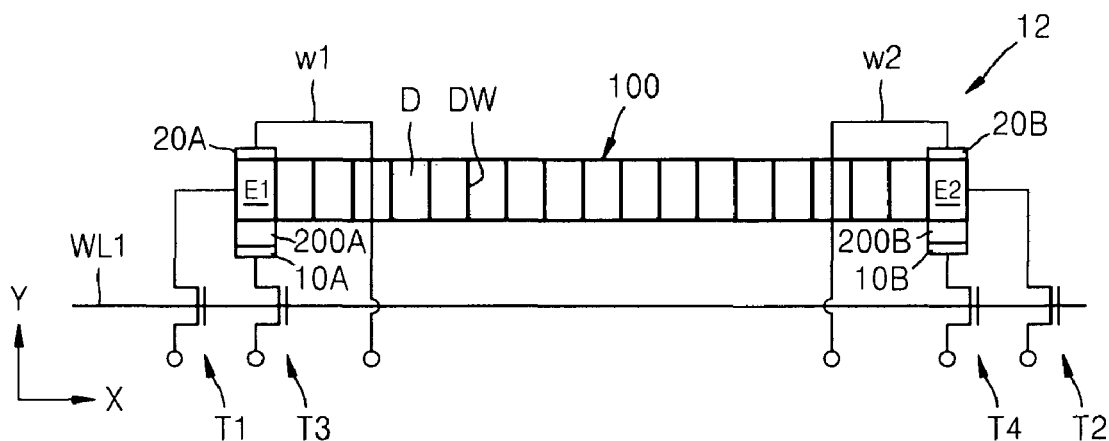
FIGS. 2 and 3 are schematic diagrams of magnetic track storage devices, in accordance with other embodiments of the present invention.
Figure 3:
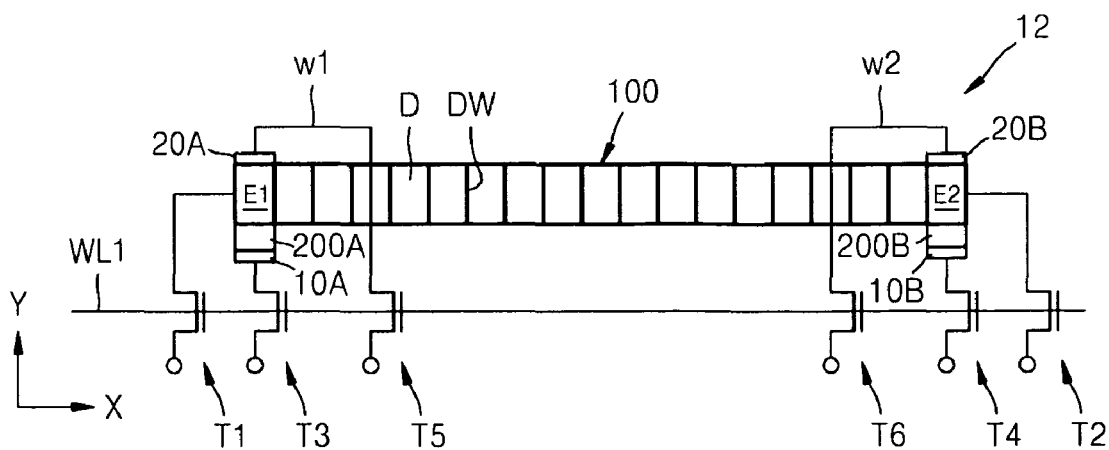

FIGS. 2 and 3 are schematic diagrams of magnetic track storage devices, in accordance with other embodiments of the present inventive concept.

Referring to FIG. 2, in this embodiment, an additional first conduction line W1 is added to allow for additional write selectivity in a case where the magnetic track storage device 12 is applied to a large-scale memory device. In this example, the additional first conduction line W1 is connected to an upper electrode 20A of the first end position E1 of the magnetic track 100. Accordingly, the write current path of this example includes the path along the first conduction line W1 and the third switching device T3, and does not include the path through the first switching device T1. Such additional write selectivity might be desired in a case where the large-scale memory device offers the feature of writing to a selected block of magnetic tracks of the device.

Also, in this embodiment, an additional second conduction line W2 is added to allow for additional read selectivity in a case where the magnetic track storage device 12 is applied to a large-scale memory device. In this example, the additional second conduction line W2 is connected to an upper electrode 20B of the second end position E2 of the magnetic track 100. Accordingly, the read current path of this example includes the path along the second conduction line W2 and the fourth switching device T4, and does not include the path through the second switching device T2. Such additional read selectivity might be desired in a case where the large-scale memory device offers the feature of reading from a selected block of magnetic tracks of the device.

In the embodiment of FIG. 2, the current path for the domain wall moving current passes through the first switching device T1 and the second switching device T2, as described above.

Referring to FIG. 3, this embodiment is similar to the embodiment of FIG. 2 above, however, additional switching elements, for example fifth and sixth transistors T5 and T6 are placed in the write current path along the first conduction line W1 and in the read current path along the second conduction line W2, respectively. In this example, the gates of the fifth and sixth transistors T5 and T6 are connected to the same control signal line WL1 as the other transistors T1, T2, T3, T4, and therefore receive the same control signals as the other transistors. The fifth and sixth transistors T5, T6 can be included for the purpose of reducing leakage current in the write current path and in the read current path.

Figure 4A:
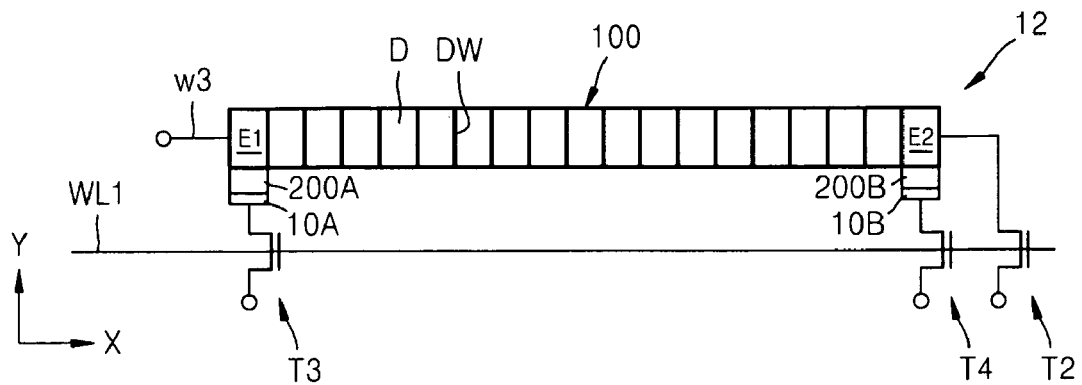
FIGS. 4A-4C are schematic diagrams of magnetic track storage devices, in accordance with other embodiments of the present invention.
Figure 4B:
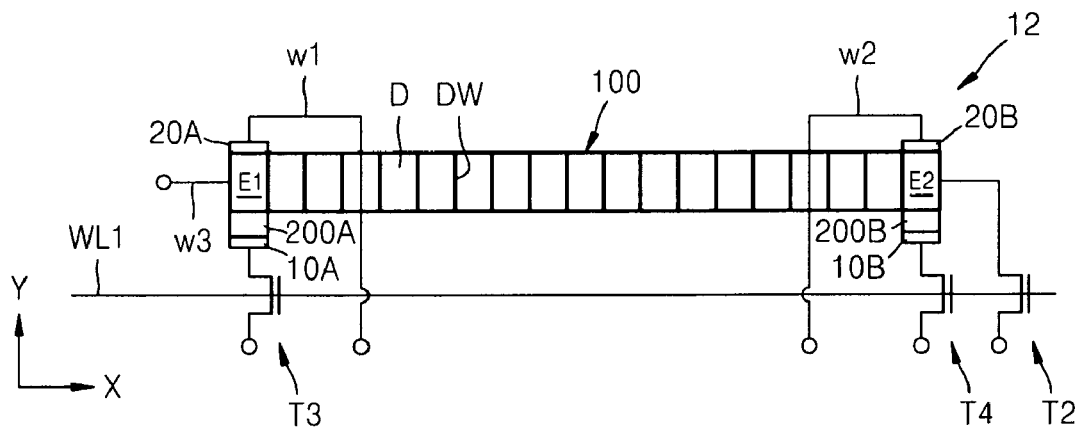
Figure 4C:
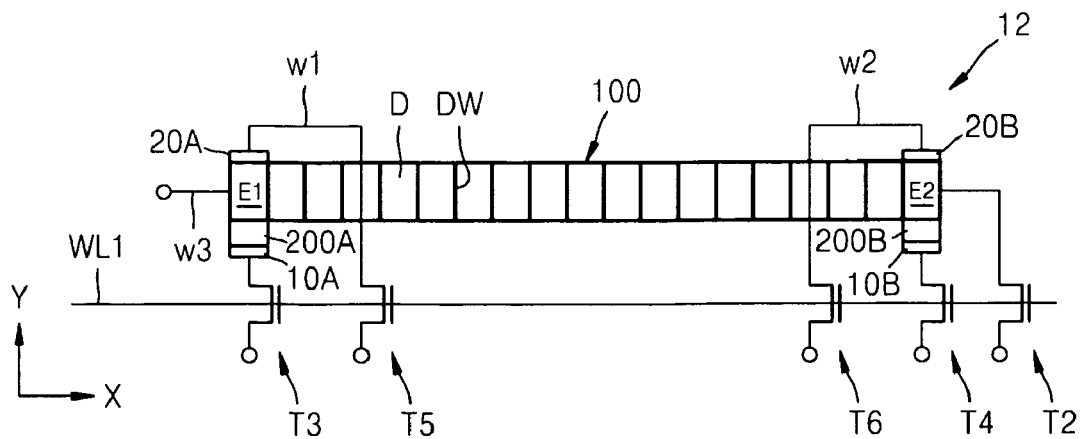

FIGS. 4A-4C are schematic diagrams of magnetic track storage devices, in accordance with other embodiments of the present invention. The embodiment of FIG. 4A is similar to the embodiment of FIG. 1 above; the embodiment of FIG. 4B is similar to the embodiment of FIG. 2 above; and the embodiment of FIG. 4C is similar to the embodiment of FIG. 3 above. One difference lies in that in each embodiment of FIGS. 4A, 4B and 4C, the first switching device, for example, transistor T1, is removed. A third conduction line W3 is connected directly to the first end E1 of the magnetic track in each embodiment. Accordingly, the current path for the domain wall moving current in each example includes the third conduction line W3, the body of the magnetic track 100, and the second switching device, for example, transistor T2. Also the write current path in the embodiment of FIG. 4A includes the third conduction line W3 and the third switching device T3. This embodiment offers the advantage of a more deeply integrated configuration, as the switching capability for the domain wall moving current unit is handled by the second transistor T2.

In other embodiments, the first switching device, for example transistor T1, can remain in position, and the second switching device, for example transistor T2, can be replaced by a conduction line directly connected to the second end E2 of the magnetic track 100. This configuration would achieve similar advantages as those described above in connection with the embodiment of FIGS. 4A-4C.

Figure 5:
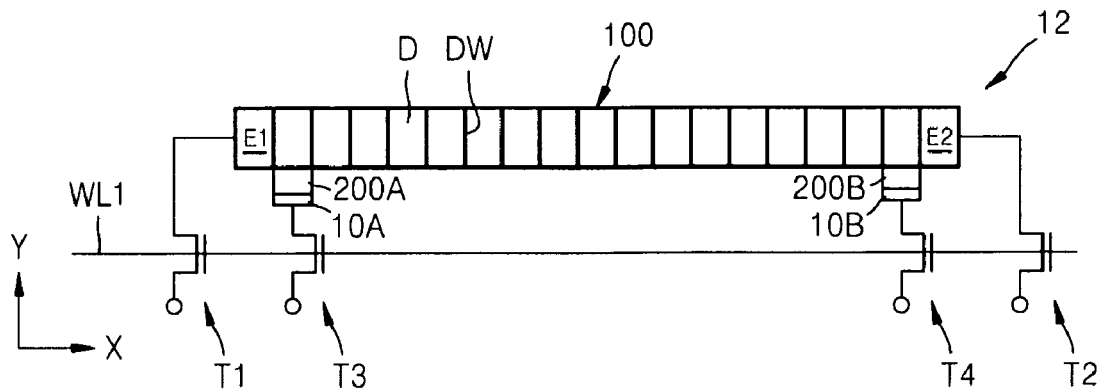
FIG. 5 is a schematic diagram of a magnetic track storage device, in accordance with another embodiment of the present invention.

FIG. 5 is a schematic diagram of a magnetic track storage device, in accordance with another embodiment of the present inventive concept. This embodiment is similar in configuration to the embodiment of FIG. 1, with the exception being that in the present embodiment, the write unit 200A is not positioned at the domain associated with the first end E1 position of the magnetic track 100. Instead, the write unit 200A is positioned at a domain that is further internal, such as the next inner domain position of the magnetic strip 100. Similarly the read unit 200B is not positioned at the domain associated with the second end E2 position of the magnetic strip 100. Instead, the read unit 200B is positioned at a domain that is further internal, such as the next inner domain position of the magnetic track 100. In these examples, the regions of the first and second ends E1, E2 of the magnetic track 100 are not used for storing data, but rather, are used exclusively as locations at which the domain wall moving current is applied to the magnetic track 100. The configuration of FIG. 5 can likewise be applied to the embodiments shown in FIGS. 2, 3, and 4A-4C, and other embodiments disclosed herein.

FIGS. 6A-6D are schematic diagrams of magnetic track storage devices, in accordance with other embodiments of the present inventive concept. These embodiments are similar in configuration to the embodiments described above, with the exception being that the write unit and read unit are combined as a read/write unit 200 positioned at a domain position that is not at or near one of the first and second ends E1, E2 of the magnetic track 100, but rather is positioned at a central region of the magnetic track, for example at domain R1 of the magnetic track 100. In this embodiment, the combined read/write unit 200 can comprise, for example, a tunnel magneto resistance device or a giant magneto resistance device, or other device suitable for storing and retrieving magnetic information.

The example embodiments of FIGS. 6A-6D illustrate a buffered arrangement in that data are initially written to one side, for example, between domain positions R1 and the first end E1, or another side, for example, between domain positions R1 and the second end E2. During the write operation, the domain wall moving current is applied in a first direction. For a subsequent read operation, the domain wall moving current is again applied in the first direction and the data elements are read and thereby shifted to the other side of the magnetic track. For a next read operation, the domain wall moving current is now applied in the second direction and the data elements are read and thereby placed on the other, original, side of the magnetic track. This is referred to as a "buffered" arrangement. The buffered arrangement offers the advantage that only a single read/write unit 200 is required for each magnetic track 100, and therefore the supporting circuitry is simpler; however, the buffered arrangement occupies about twice the recording area of the non-buffered arrangements of FIGS. 1-3, 4A-4C and 5.

Figure 6A:
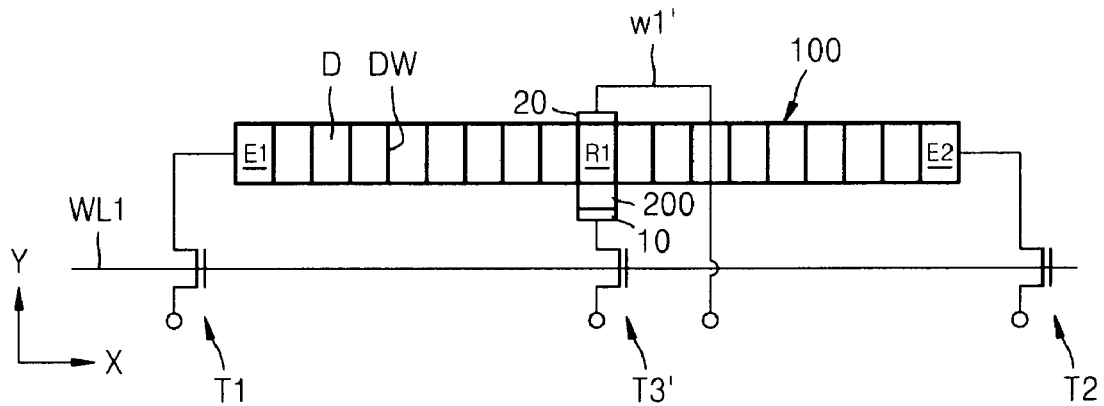
FIGS. 6A-6D are schematic diagrams of magnetic track storage devices, in accordance with other embodiments of the present invention.

In the embodiment of FIG. 6A, the current path for applying the read current and the write current to the single read/write unit 200 at domain location R1 of the magnetic track 100 includes a first conduction line w1' and the third switching device T3', in a manner similar to the configuration of the embodiment to FIG. 2 above.

Figure 6B:
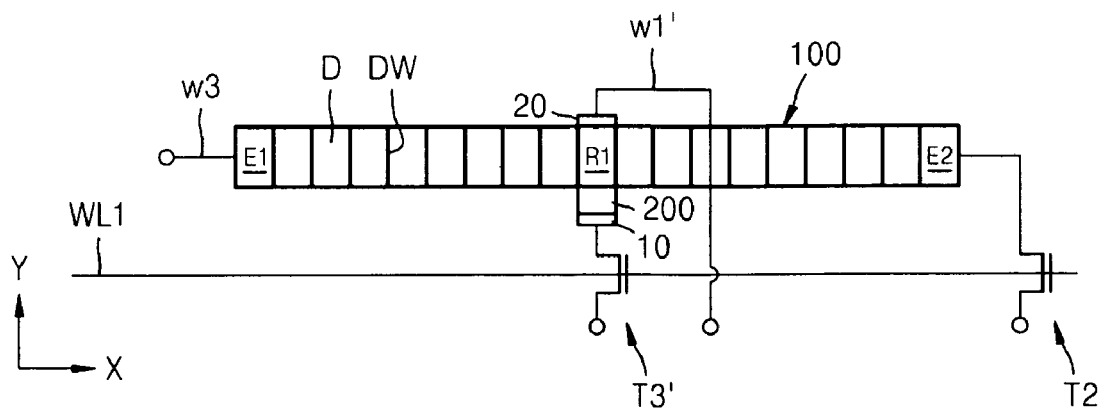

The embodiment of FIG. 6B is similar in configuration to the embodiment of FIG. 6A, with the exception being that the first switching device T1 is removed, and a third conduction line w3 is connected directly to the first end E1 of the magnetic track 100, in a manner similar to the configuration of the embodiments of FIGS. 4A-4C above.

Figure 6C:
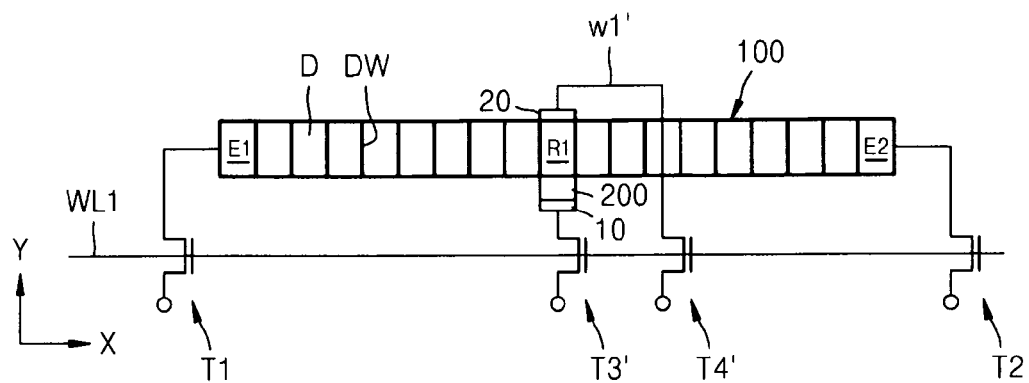

In the embodiment of FIG. 6C, the current path for applying the read current and the write current to the single read/write unit 200 at domain location R1 of the magnetic track 100 further includes a fourth transistor T4', in a manner similar to the configuration of the embodiments of FIG. 3 above.

Figure 6D:
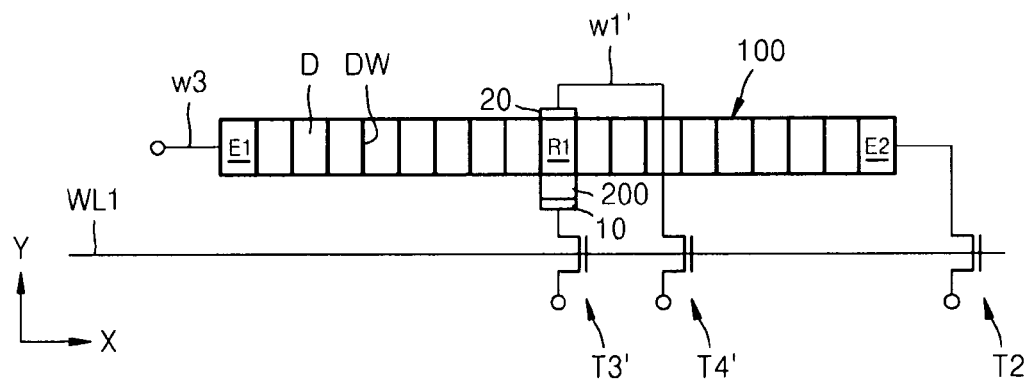

The embodiment of FIG. 6D is similar in configuration to the embodiment of FIG. 6C, with the exception being that the first switching device T1 is removed, and a third conduction line w3 is connected directly to the first end E1 of the magnetic track 100, in a manner similar to the configuration of the embodiments of FIGS. 4A-4C above.

In the above example embodiments, the switching devices for applying the read current to the read unit, the write current to the write unit and the domain wall moving current to the magnetic track include one or more of transistors T1, T2, T3, T3', T4, and T4', and the gates of these transistors are connected to a same control signal line WL1. As a result, the transistors associated with the read current, the write current and the domain wall moving current all receive the same control signal. Accordingly, the above-described principles and advantages of such an arrangement apply to these embodiments.

In the above example embodiments, the write unit 200A, the read unit 200B, and the write/read unit 200 can optionally include a pinned layer, the direction of magnetization of which is pinned at one side of the magnetic track 100, e.g., the bottom of the magnetic track 100. A separation layer can be formed between the pinned layer and the magnetic track 100. However, the write unit 200A and the write/read unit 200 can optionally include a first pinned layer and a second pinned layer that are formed on a bottom surface and a top surface of the magnetic track 100, respectively. In this case, the direction of magnetization of the first pinned layer can be opposite the direction of magnetization of the second pinned layer. A separation layer can be formed among the first and second pinned layers and the magnetic track 100. As described above, when the write unit 200A and the write/read unit 200 include two pinned layers (the first and second pinned layers), an electron spin torque can be applied to the magnetic track 100 from the two pinned layers, and thus, a write operation can be readily performed. Although the read unit 200B can also optionally include two pinned layers, only one of the two pinned layers need be effective during a read operation.

Figure 7:
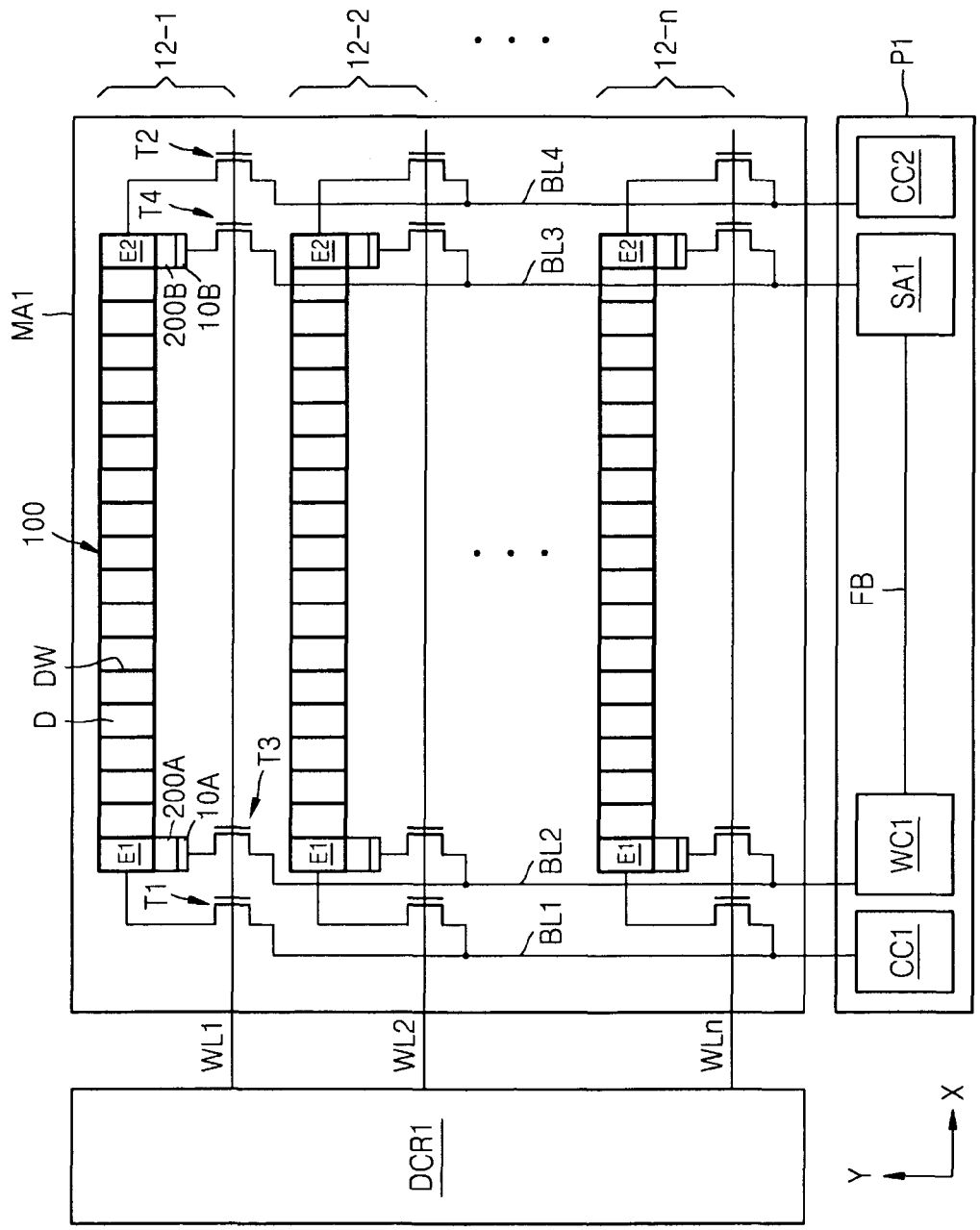
FIG. 7 is a schematic diagram of a memory device employing a magnetic track storage device, in accordance with another embodiment of the present invention.

FIG. 7 is a schematic diagram of a memory device employing a magnetic track storage device, in accordance with another embodiment of the present inventive concept. The memory device includes a select line decoder DCR1, a memory cell array MA1, and a control circuit P1. The operation of an example embodiment of the select line decoder DCR1 is described in further detail below in connection with FIG. 17, and activates at least one of a number of the control lines, which operate as magnetic track select lines WL1, WL2, . . . WLn, for activating the respective magnetic track storage devices. The control circuit P1 includes a first current controller CC1, a second current controller CC2, a write current controller WC1 and a sense amplifier controller SA1. The memory cell array MA1 includes a plurality of, for example n, magnetic track storage devices 12-1, 12-2, 12-n, for example of the type described above in connection with FIG. 1.

In this example, the first switching devices T1 are connected to the first current controller CC1 via conductive line BL1 and the second switching devices are connected to the second current controller CC2 via conductive line BL4. The third switching devices T3 are connected to the write current controller WC1 via conductive line BL2, and the fourth switching devices T4 are connected to the sense amplifier controlled SA1 via conductive line BL3, as shown. In this manner, a selected magnetic track storage device 12-1, as selected by the select line decoder DCR1 activating the corresponding select line WL1, is placed in the current path of the first current controller CC1 and the write current controller WC1 for writing data elements to the selected magnetic track 100. The selected magnetic track storage device 12-1 is also placed in the current path of the second current controller CC2 and the sense amplifier controller SA1 for reading data elements from the selected magnetic track 100 and is placed in the current path of the first current controller CC1 and the second current controller CC2 for applying a domain wall moving current to the selected magnetic track 100. In this embodiment, conductive lines BL1 and BL4 operate as domain wall moving current control lines, conductive lines BL1 and BL2 operate as write current control lines, and conductive lines BL3 and BL4 operate as read current control lines.

In one embodiment, the data element located at the domain position associated with the second end E2 of the magnetic track 100 and sensed by the sense amplifier controller SA1 during a read operation is automatically transferred to the write current controller WC1 via feedback line FB and stored at the first end of the magnetic track 100 by the write unit 200A. In this manner, a buffer is not required for temporary storage of the data read by the read unit 200B.

Figure 8:
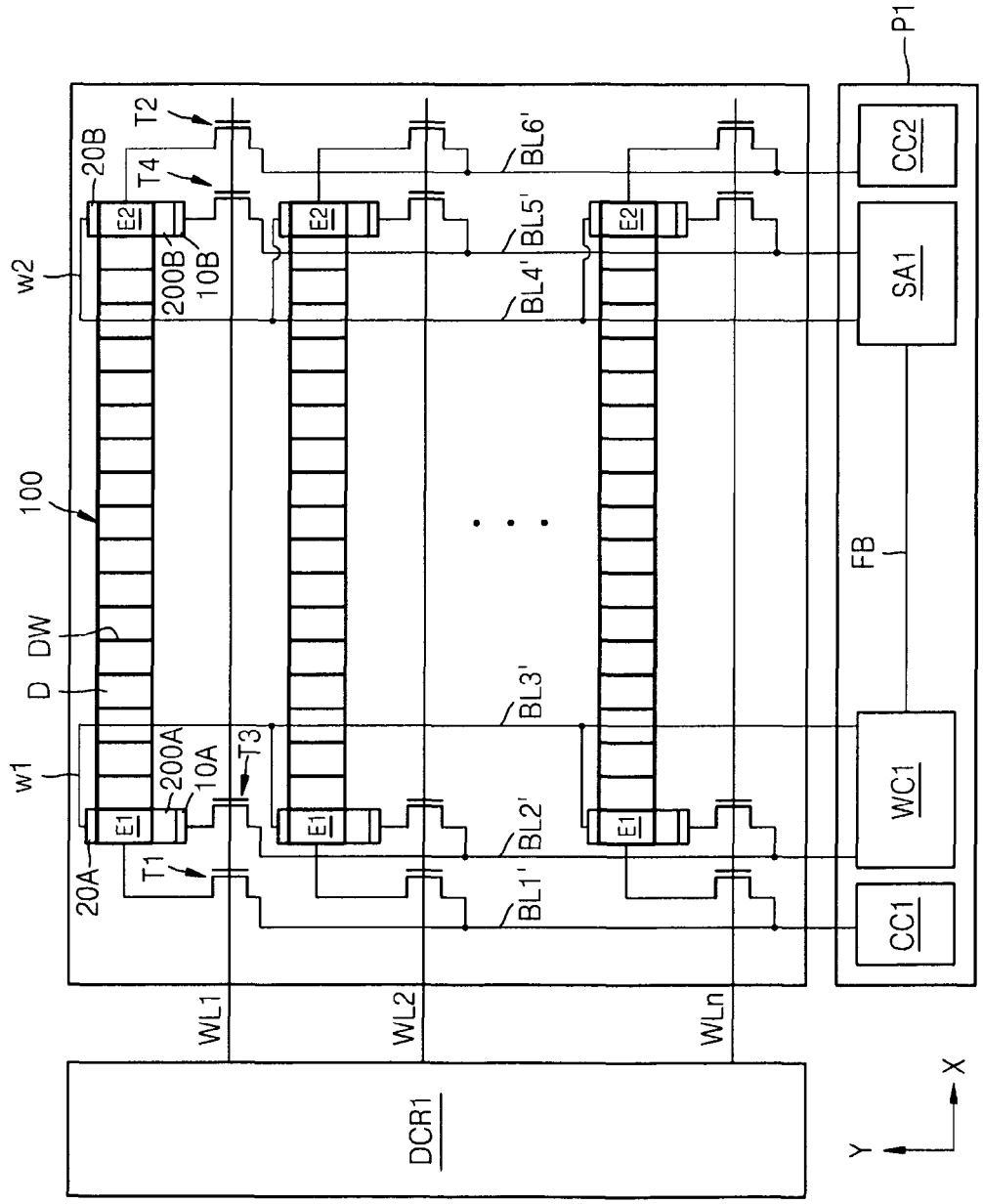
FIGS. 8-12 are schematic diagrams of memory devices employing magnetic track storage devices, in accordance with other embodiments of the present invention.

FIG. 8 is a schematic diagram of a memory device employing a magnetic track storage device, in accordance with another embodiment of the present inventive concept. In this embodiment, the memory cell array includes a plurality of magnetic track storage devices, for example of the type described above in connection with FIG. 2. In this embodiment, the write current controller WC1 is further connected to the additional first conduction line W1 via conduction line BL3', and the sense amplifier controller SA1 is further connected to the additional second conduction line W2 via conduction line BL4'.

Figure 9:
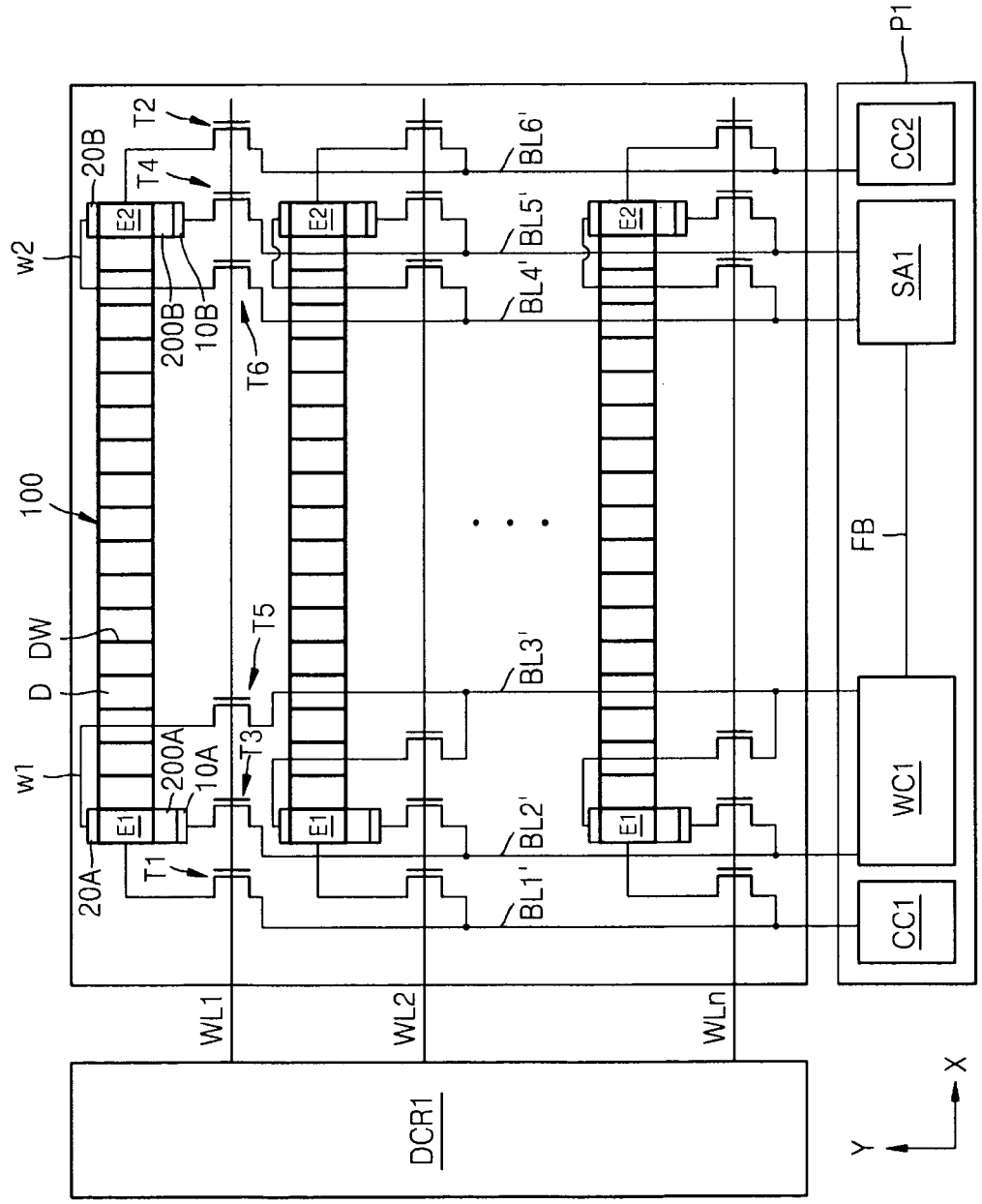

FIG. 9 is a schematic diagram of a memory device employing a magnetic track storage device, in accordance with another embodiment of the present inventive concept. In this embodiment, the memory cell array includes a plurality of magnetic track storage devices, for example of the type described above in connection with FIG. 3. In this embodiment the write current controller WC1 is further connected to the fifth switching devices T5 via conduction line BL3', and the sense amplifier controller SA1 is further connected to the sixth switching devices T6 via conduction line BL4'.

Figure 10:
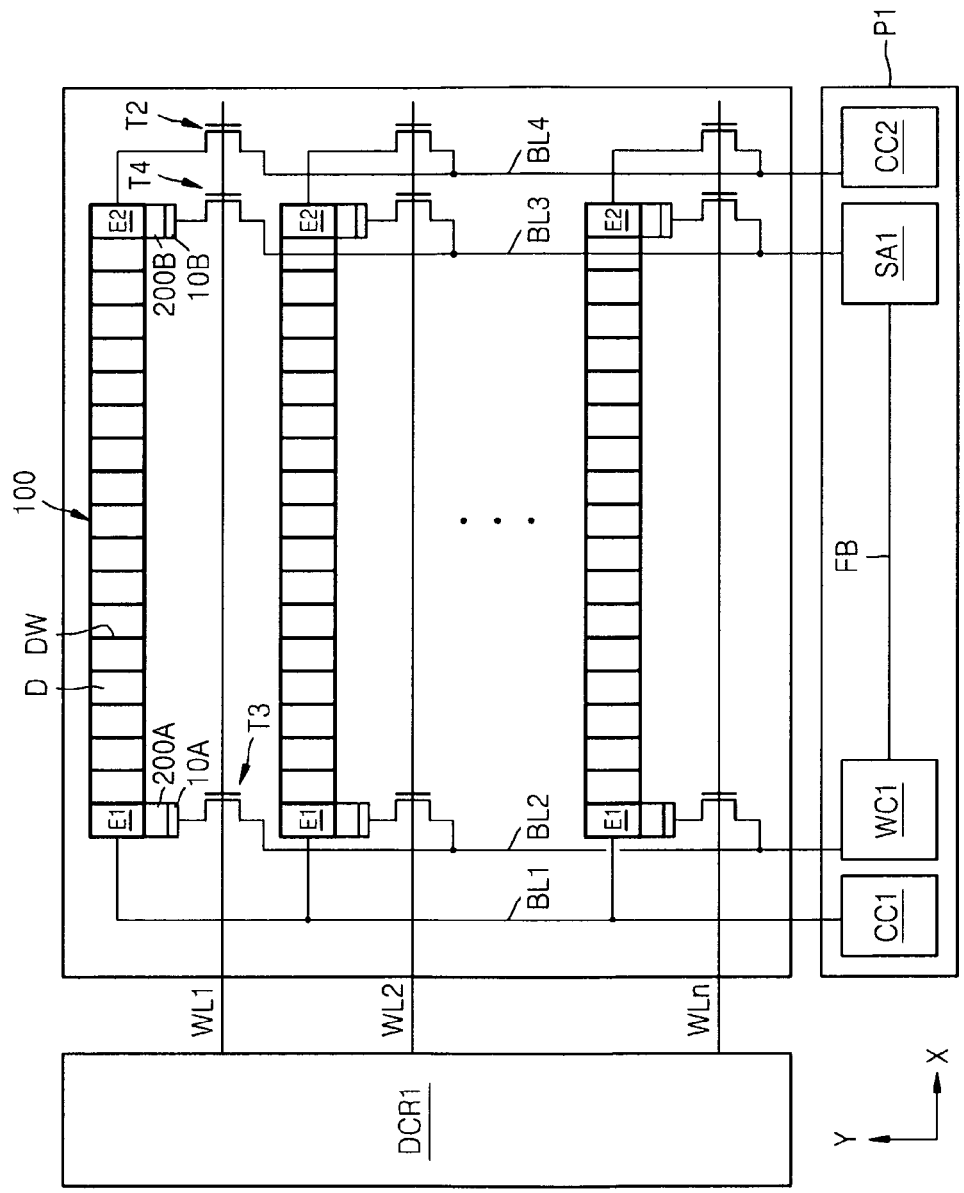

FIG. 10 is a schematic diagram of a memory device employing a magnetic track storage device, in accordance with another embodiment of the present inventive concept. In this embodiment, the memory cell array includes a plurality of magnetic track storage devices, for example of the type described above in connection with FIG. 4A. In this embodiment, the first current controller CC1 is connected directly to the first end E1 of the magnetic tracks 100 via conduction line BL1. The conduction line BL1 operates in the current path to apply both domain wall moving current and to apply write current, and the first current controller CC1 likewise operates during both types of operations.

Figure 11:
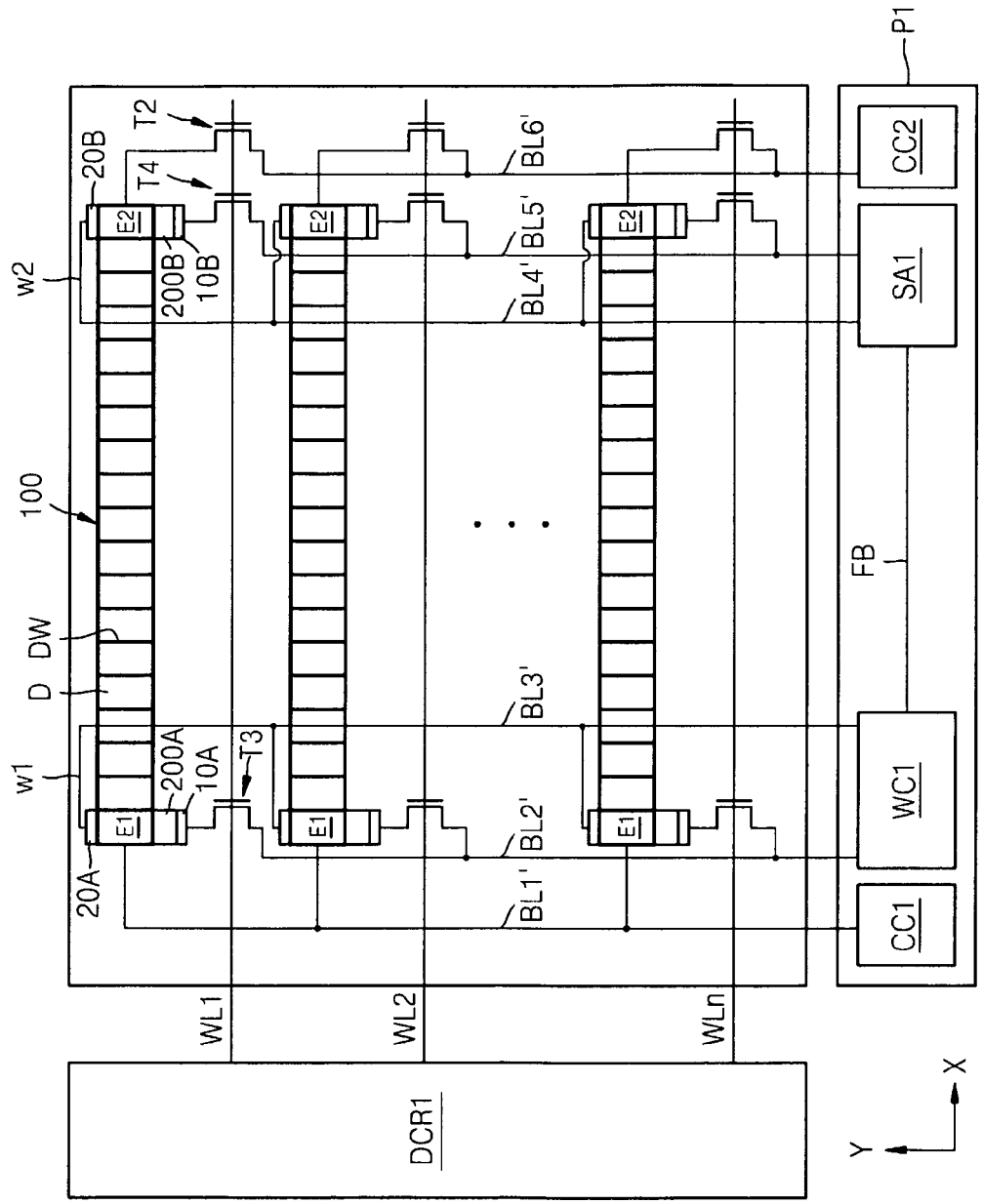

FIG. 11 is a schematic diagram of a memory device employing a magnetic track storage device, in accordance with another embodiment of the present inventive concept. In this embodiment, the memory cell array includes a plurality of magnetic track storage devices, for example of the type described above in connection with FIG. 4B. In this embodiment, like the embodiment of FIG. 10, the first current controller CC1 is connected directly to the first end E1 of the magnetic tracks 100 via conduction line BL1'.

Figure 12:
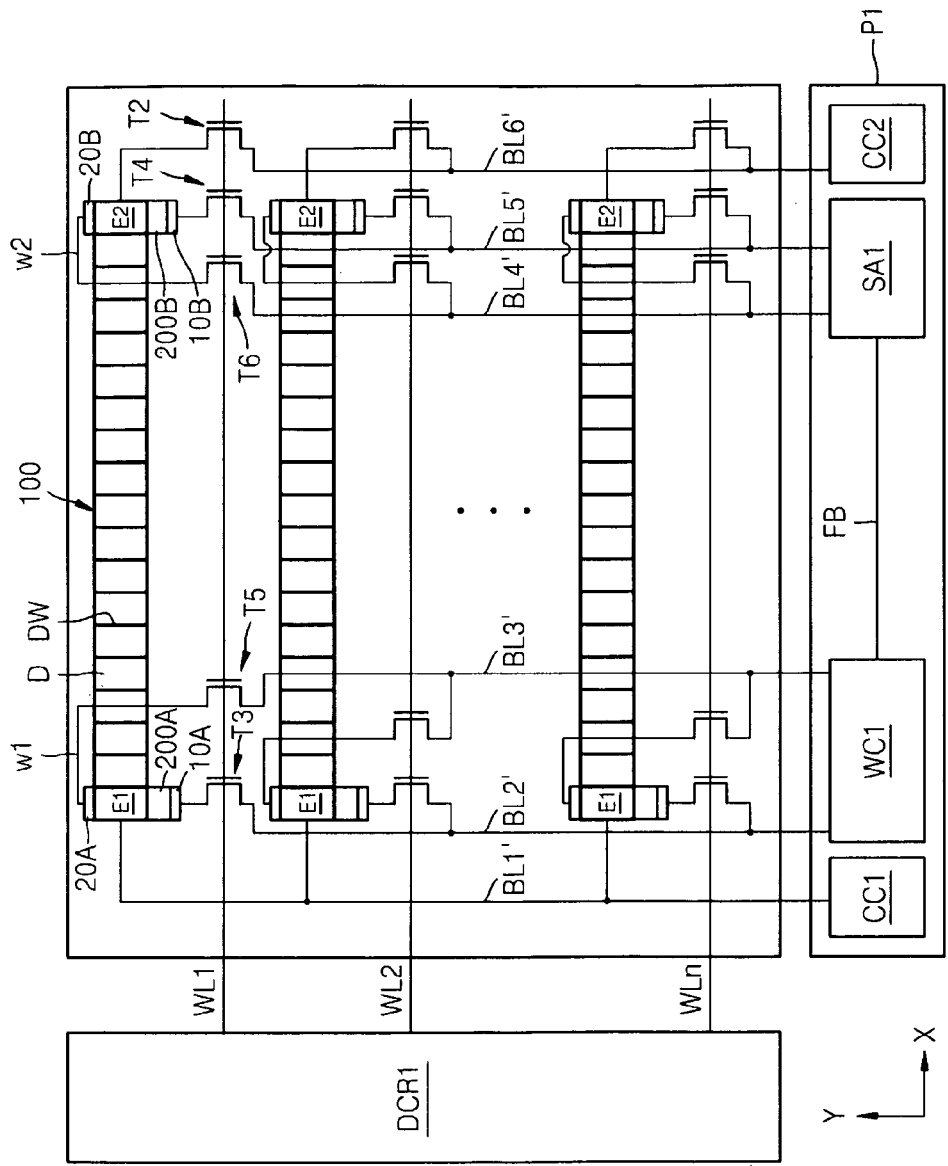

FIG. 12 is a schematic diagram of a memory device employing a magnetic track storage device, in accordance with another embodiment of the present inventive concept. In this embodiment, the memory cell array includes a plurality of magnetic track storage devices, for example of the type described above in connection with FIG. 4C. In this embodiment, like the embodiment of FIGS. 10 and 11, the first current controller CC1 is connected directly to the first end E1 of the magnetic tracks 100 via conduction line BL1'.

The above memory device embodiments can similarly incorporate the magnetic track storage device of the type described above in connection with FIG. 5, in which the read unit 200A and write unit 200B are positioned at domain locations that are at inner positions, and not end positions, of the magnetic track 100.

Figure 13:
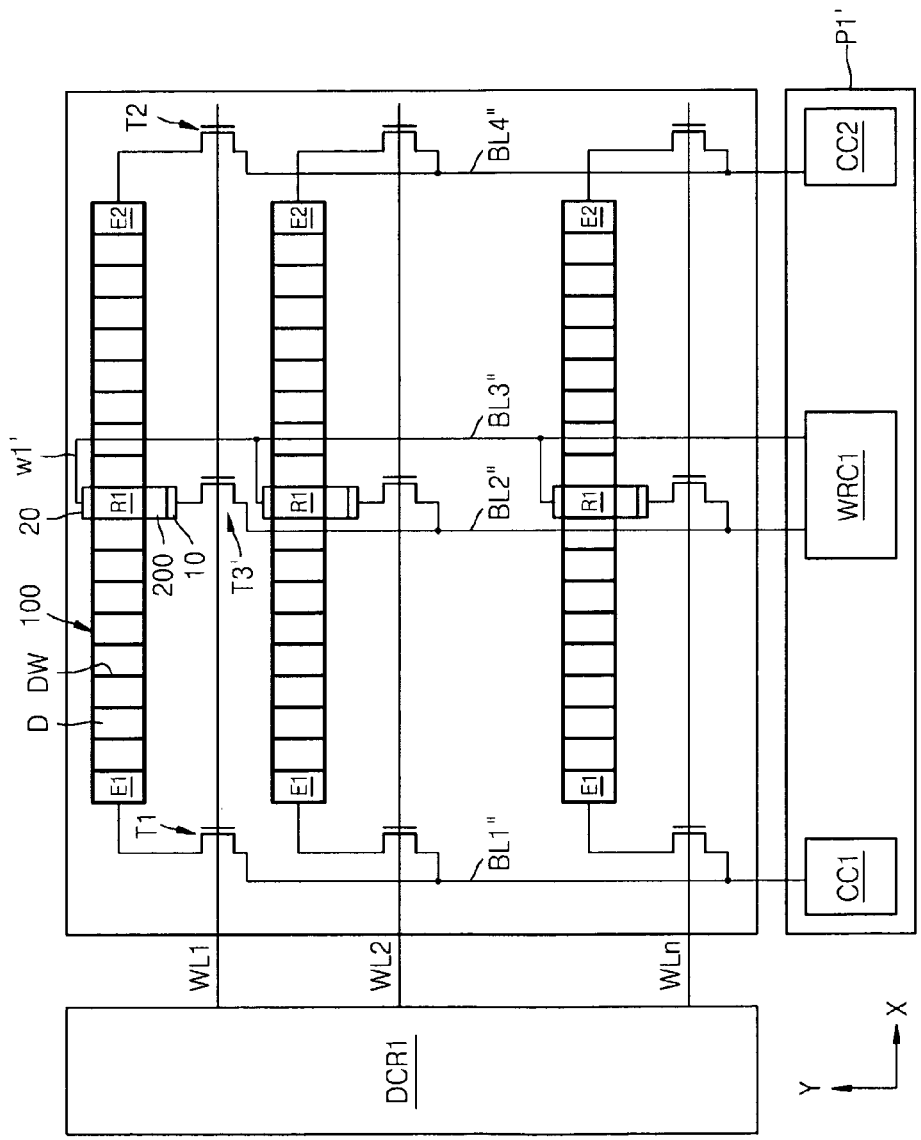
FIGS. 13-16 are schematic diagrams of memory devices employing a magnetic track storage device, in accordance with other embodiments of the present invention.

FIG. 13 is a schematic diagram of a memory device employing a magnetic track storage device, in accordance with another embodiment of the present inventive concept. In this embodiment, the memory cell array includes a plurality of magnetic track storage devices, for example of the buffered-configuration type described above in connection with FIG. 6A. In this memory device embodiment, the combined read-write unit 200 and the first conduction line w' of each magnetic track storage device are connected to a combined write current/read current controller WRC1 via conduction lines BL2" and BL3".

Figure 14:
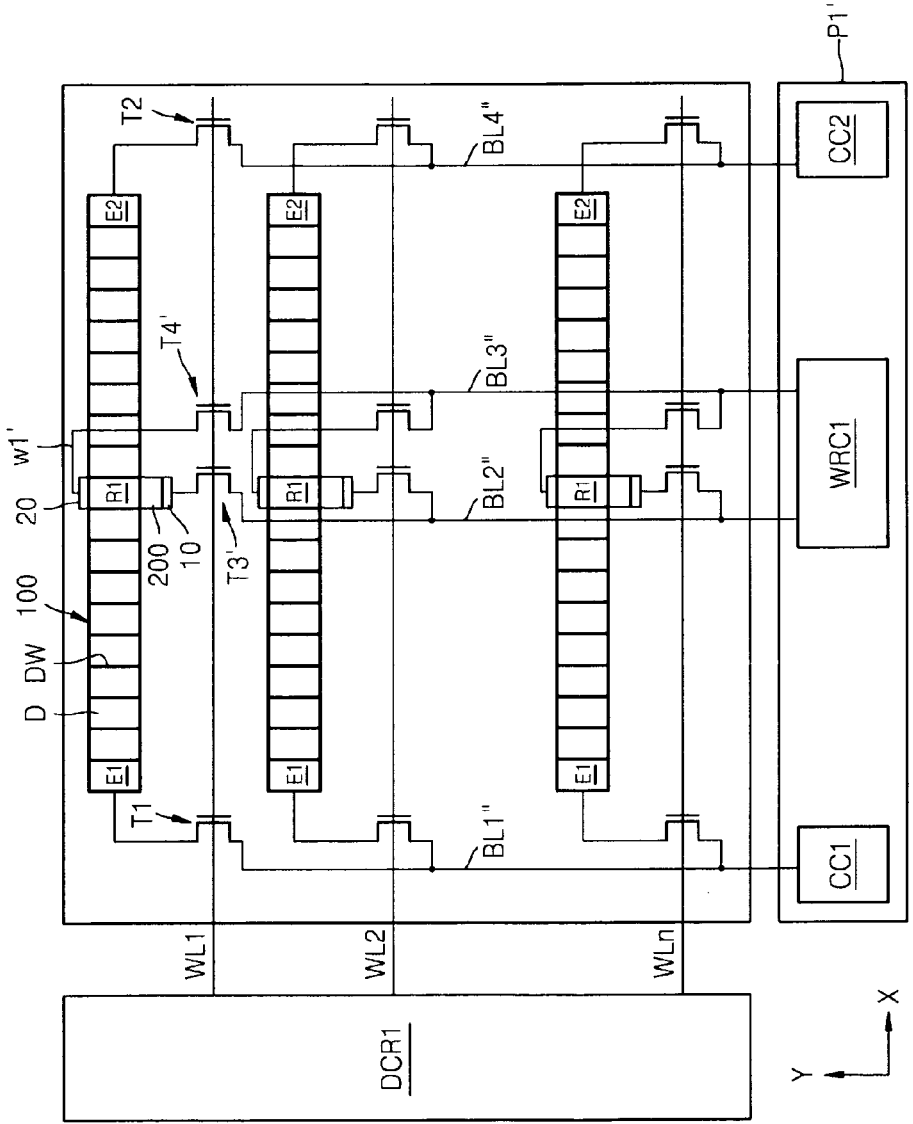

FIG. 14 is a schematic diagram of a memory device employing a magnetic track storage device, in accordance with another embodiment of the present inventive concept. In this embodiment, the memory cell array includes a plurality of magnetic track storage devices, for example of the buffered-configuration type described above in connection with FIG. 6C. In this memory device embodiment, the combined read-write unit 200 of each magnetic track storage device is connected to a combined write current/read current controller WRC1 via conduction lines BL2", BL3". Also, the current path for applying the read current and the write current to the single read/write unit 200 at domain location R1 of the magnetic track 100 further includes a fourth transistor T4', in a manner similar to the configuration of the embodiments of FIG. 6C above.

Figure 15:
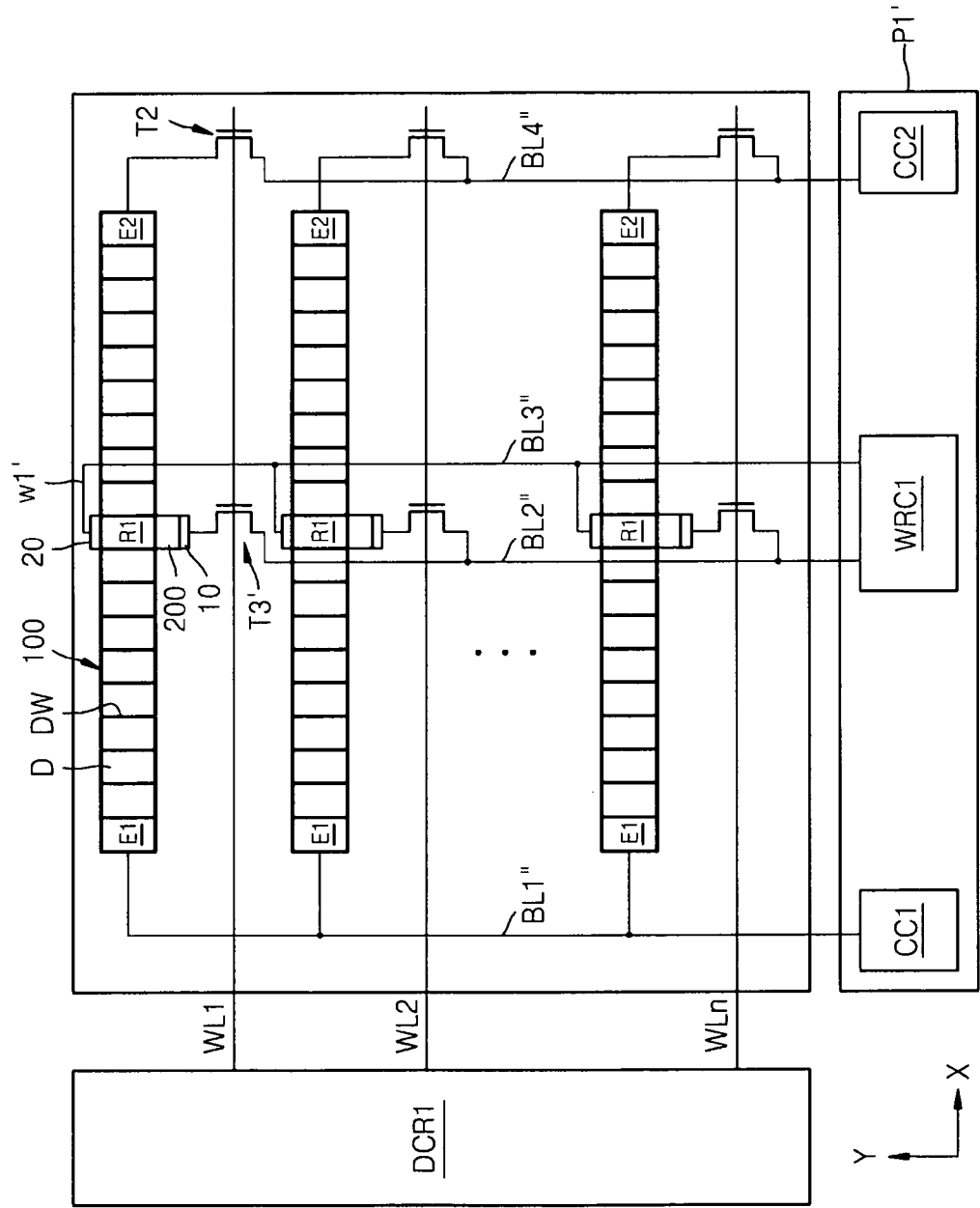

FIG. 15 is a schematic diagram of a memory device employing a magnetic track storage device, in accordance with another embodiment of the present inventive concept. In this embodiment, the memory cell array includes a plurality of magnetic track storage devices, for example of the buffered-configuration type described above in connection with FIG. 6B. In this memory device embodiment, the combined read-write unit 200 of each magnetic track storage device is connected to a combined write current/read current controller WRC1 via conduction lines BL2", BL3". Also, in this embodiment, the first switching device T1 is removed, and the conduction line BL1" is connected directly to the first end E1 of the magnetic tracks 100, in a manner similar to the configuration of the embodiments of FIGS. 6B and 6D above.

Figure 16:
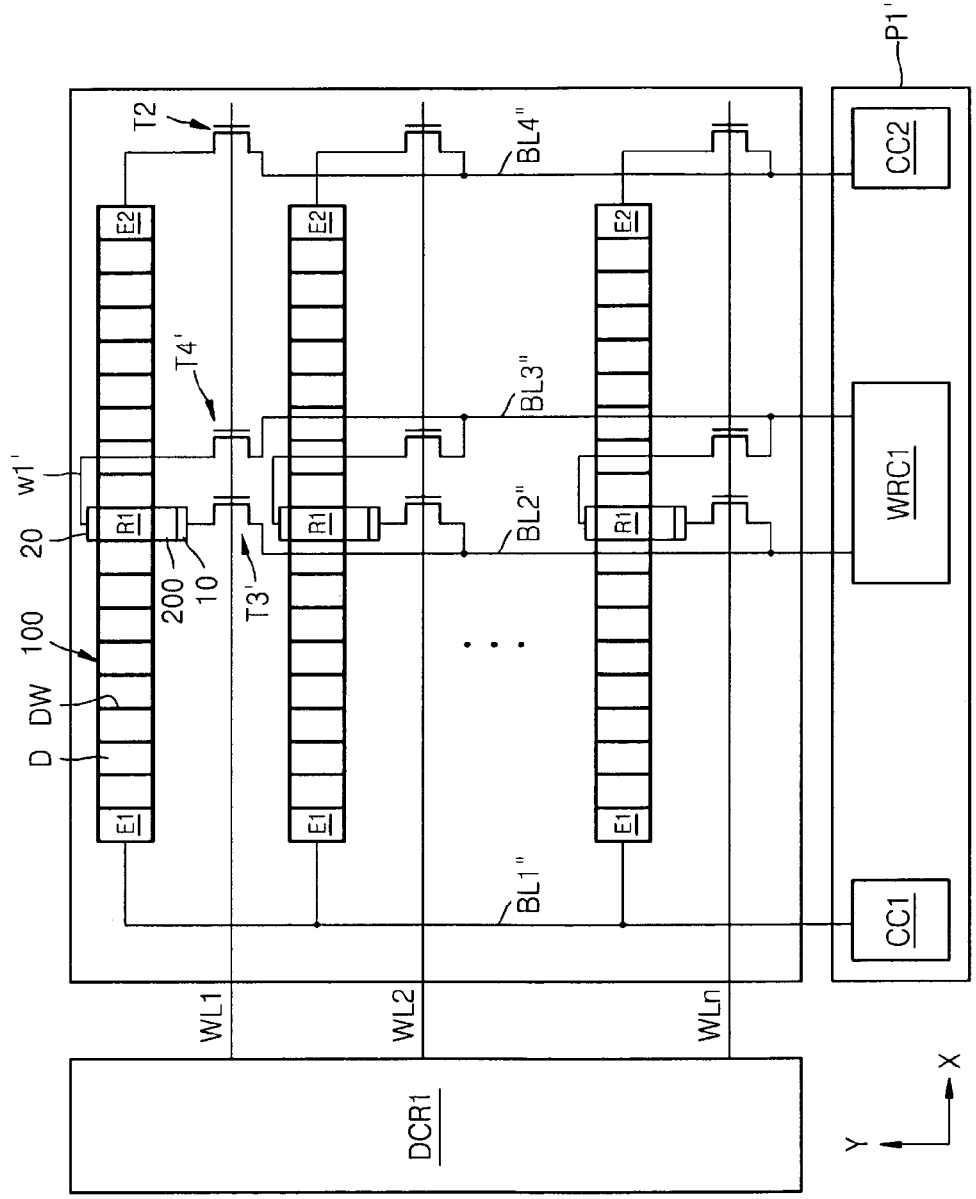

FIG. 16 is a schematic diagram of a memory device employing a magnetic track storage device, in accordance with another embodiment of the present inventive concept. In this embodiment, the memory cell array includes a plurality of magnetic track storage devices, for example of the buffered-configuration type described above in connection with FIG. 6D. In this memory device embodiment, the combined read-write unit 200 of each magnetic track storage device is connected to a combined write current/read current controller WRC1 via conduction lines BL2" and BL3". Also, the current path for applying the read current and the write current to the single read/write unit 200 at domain location R1 of the magnetic track 100 further includes a fourth transistor T4', in a manner similar to the configuration of the embodiments of FIG. 3 above. Also, in this embodiment, the first switching device T1 is removed, and the conduction line BL1" is connected directly to the first end E1 of the magnetic tracks 100, in a manner similar to the configuration of the embodiments of FIG. 6D above.

Figure 17:
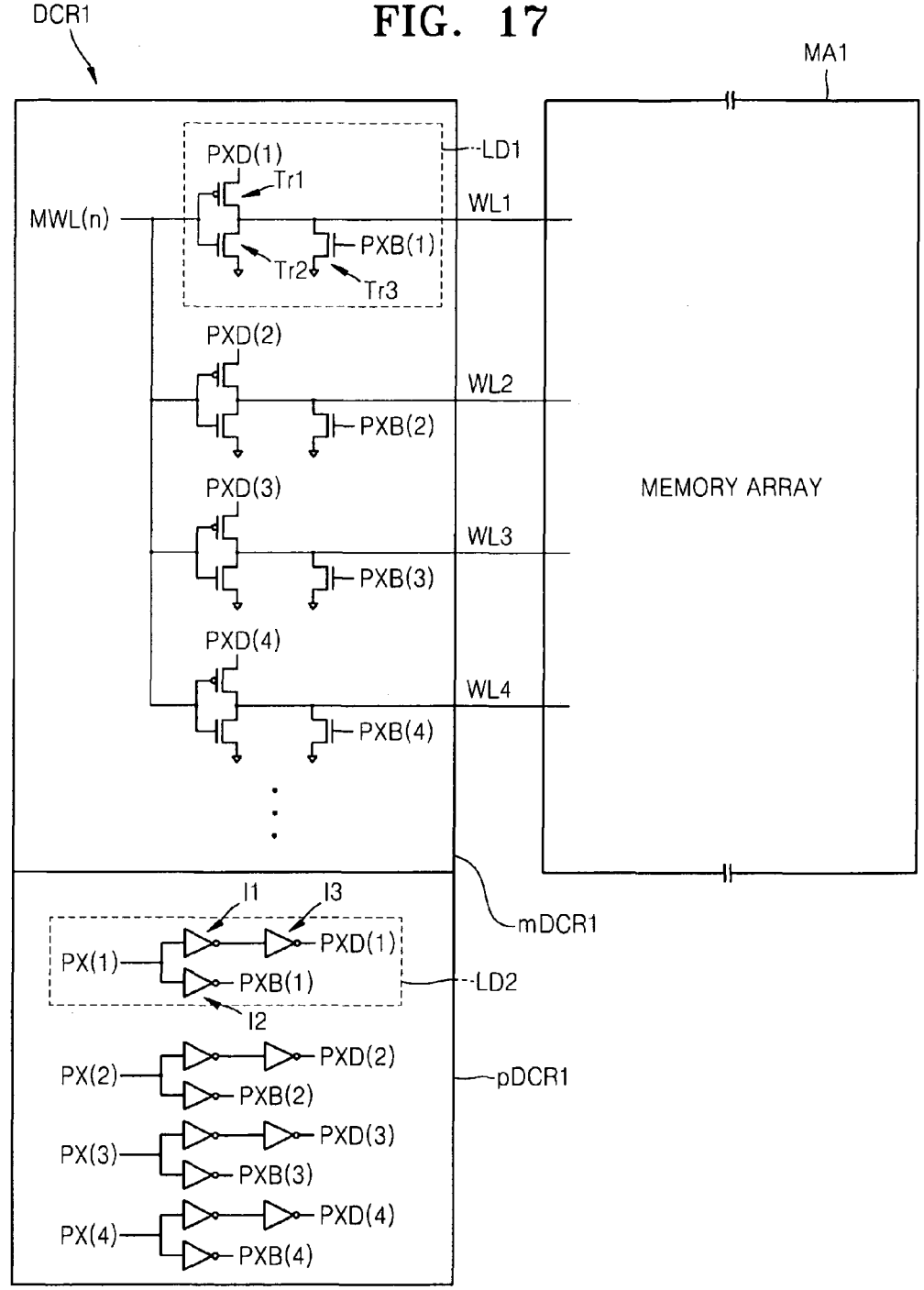
FIG. 17 is a schematic diagram of a select line decoder DCR1, in accordance with an embodiment of the present invention.

FIG. 17 is a schematic diagram of a select line decoder DCR1, in accordance with an embodiment of the present inventive concept. In the present embodiment, the select line decoder DCR1 includes a main decoder unit mDCR1 and a pre-decoder unit pDCR1. The select line decoder DCR1 receives a main wordline MWL(n) and, in response, activates one or more of the control lines, or select lines WL1 . . . WL4. The main decoder unit mDCR1 includes a plurality of first logic devices LD1 and the pre-decoder unit pDCR1 includes a plurality of second logic devices LD2, each set of logic devices LD1, LD2 corresponding with one of the select lines WL1 . . . WL4. Each first logic device LD1 can include transistors Tr1, Tr2, Tr3, configured, for example, as shown, and each second logic device LD2 can include inverters Ir1, Ir2, Ir3, configured, for example, as shown. The wordlines WL1 to WL4 can be connected in parallel to the main wordline MWL(n) of the main decoder unit mDCR1. The main decoder unit mDCR1 can include a plurality of the main wordlines MWL(n), and a plurality of wordlines can be connected to each of the main wordlines MWL(n). A first logic device LD1 can be included between each of the main wordlines MWL(n) and each of the wordlines WL1 . . . WL4. It is assumed that the first logic device LD1 is positioned between each of the main wordlines MWL(n) and the first wordline WL1. The first logic device LD1 can include an inverter comprising the first and second transistors Tr1 and Tr2 that are connected to each other in an inverter configuration, and can include the third transistor Tr3 connected to the inverter. A drain of the first transistor Tr1 and a gate of the third transistor Tr3 are referred to as a first drain input unit terminal PXD(1) and a first gate input terminal PXB(1), respectively. A predetermined voltage can be applied to the first wordline WL1 according to signals supplied to the respective first drain input terminal PXD(1) and the first gate input terminal PXB(1). A logic device, such as the first logic device LD1, can be included between each of the second to fourth wordlines WL2 to WL4 and each of the main wordlines MWL(n). Here, reference numerals 'PXD(2)' to 'PXD(4)' denote second to fourth drain input terminals, and reference numerals 'PXB(2)' to 'PXB(4)' denote second to fourth gate input terminals, respectively. Signals supplied to the drain input terminals PXD(1) to PXD(4) and the gate input terminals PXB(1) to PXB(4) can be controlled by the pre-decoder unit pDCR1.

The pre-decoder pDCR1 can further include a plurality of the second logic devices LD2. The total number of second logic device LD2 can be equal to the total number of the first to fourth wordlines WL1 to WL4 connected to the main wordlines MWL(n). A first second logic circuit LD2 of the plurality of the second logic devices LD2 can include first and second inverters I1 and I2 that are connected in parallel to a first input line PX(1) and a third inverter I3 connected in series to the first inverter I1. In this case, assuming a signal '1' is supplied to the first input line PX(1), then a signal '0' is output from the second inverter I2 and a signal '1' is output from the third inverter I3. A reference numeral 'PXB(1)' allocated to an output terminal of the second inverter I2 means that the output terminal of the second inverter I2 is connected to the first gate input terminal PXB(1), and a reference numeral 'PXD(1)' allocated to an output terminal of the third inverter I3 means that the output terminal of the third inverter I3 is connected to the first drain input terminal PXD(1). Such reference numerals allocated to respective second to fourth second logic devices LD2 should also be understood in the same way. Reference numerals 'PX(2)' to 'PX(4)' denote input lines, for example, second to fourth input lines, of the respective second to fourth second logic devices LD2. Assuming that signals '1', '0', '0', and '0' are supplied to the first to fourth input lines PX(1) to PX(4), respectively, then only the first wordline WL1 would be activated among the first to fourth wordlines WL1 to WL4. FIG. 17 illustrates an example of the circuit construction of the select line decoder DCR1, and the select line decoder DCR1 according to the present invention is not limited thereto. Various types of decoders in the field of electronic devices can be applied to an information storage device according to an embodiment of the present invention.

Figure 18:
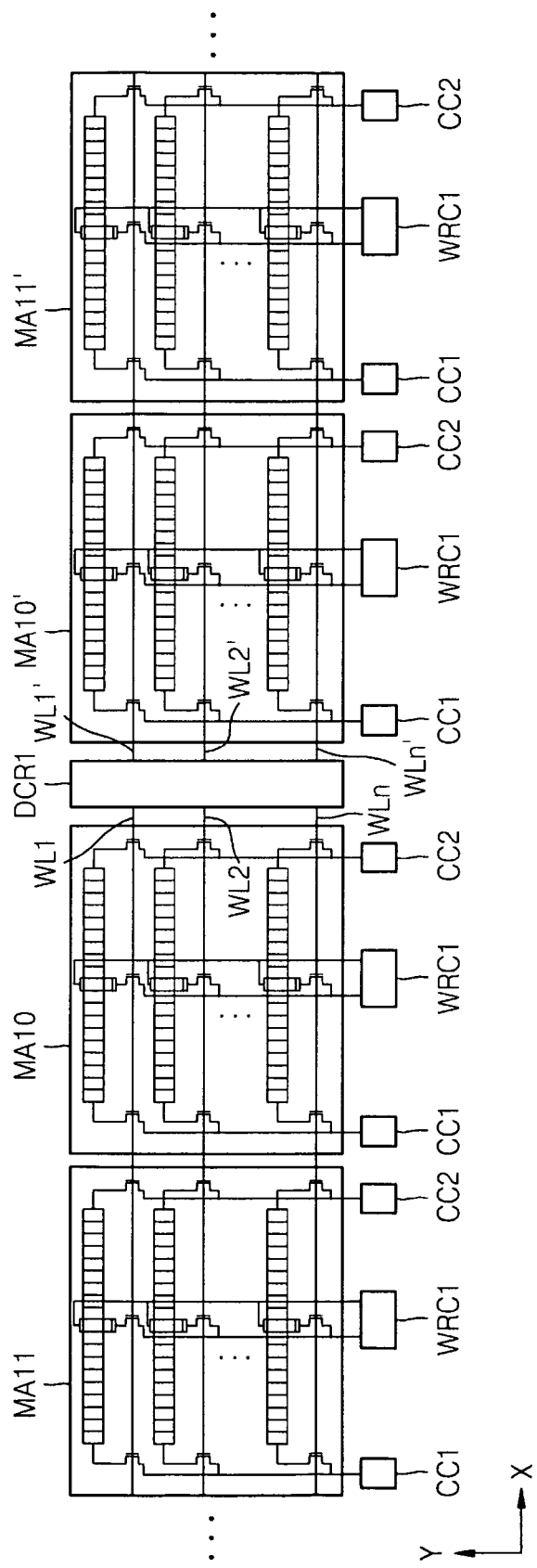
FIGS. 18-21 are schematic diagrams of memory devices employing a plurality of memory blocks with magnetic track storage devices, in accordance with other embodiments of the present invention.

FIG. 18 is a schematic diagram of a memory device employing a plurality of memory blocks with magnetic track storage devices, in accordance with another embodiment of the present inventive concept. In this embodiment, a memory device includes a plurality of memory cell array blocks MA11, MA10, MA10', MA11'. Each memory cell array block MA11, MA10, MA10', MA11' includes an associated first current controller CC1, second current controller CC2, and combined write current/read current controller WRC1. The two leftmost memory cell array blocks MA11, MA10 share common select lines WL1, WL2 . . . WLn, and the two rightmost memory cell array blocks MA10', MA11' share common select lines WL1', WL2' . . . WLn'. A single select line decoder DCR1 services the select lines WL1, WL2 . . . WLn shared by the leftmost memory cell array blocks MA11, MA10, and optionally, the same single select line decoder DCR1 services the select lines WL1', WL2' . . . WLn' shared by the rightmost memory cell array blocks MA10', MA11'.

Figure 19:
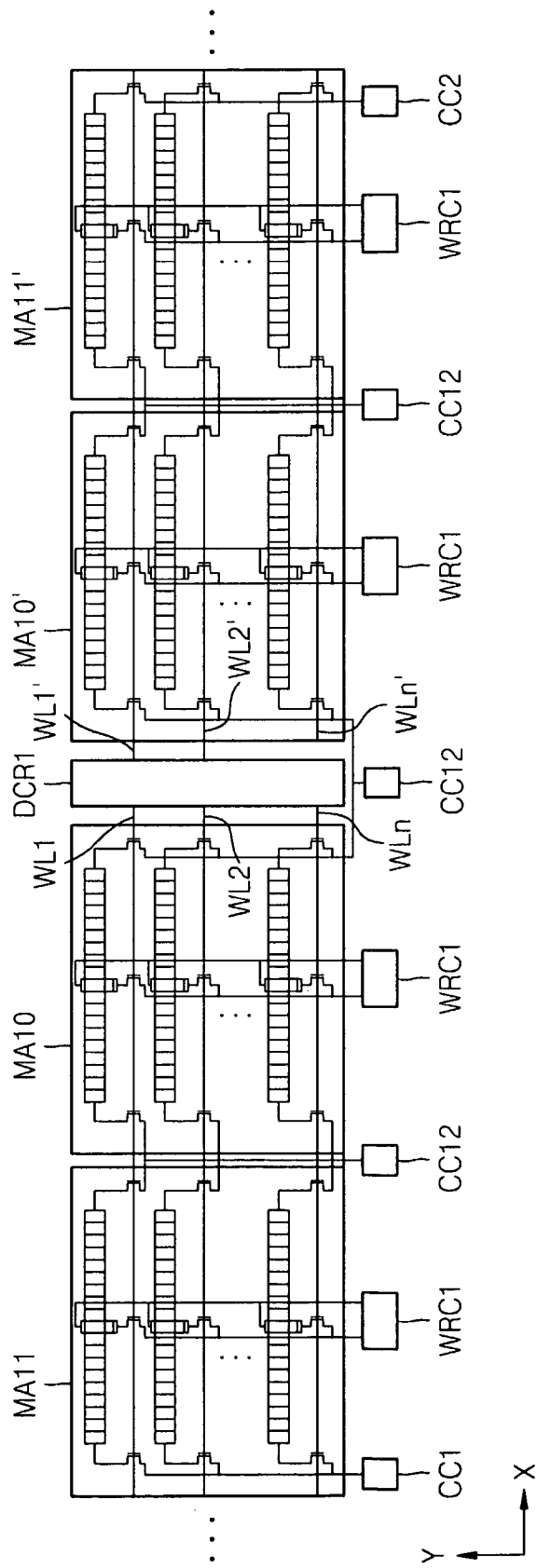

FIG. 19 is a schematic diagram of a memory device employing a plurality of memory blocks with magnetic track storage devices, in accordance with another embodiment of the present inventive concept. In this embodiment, a memory device includes a plurality of memory cell array blocks MA11, MA10, MA10', MA11'. Each memory cell array block MA11, MA10, MA10', MA11' includes an associated combined write current/read current controller WRC1. Like the embodiment of FIG. 18, the two leftmost memory cell array blocks MA11, MA10 share common select lines WL1, WL2 . . . WLn, and the two rightmost memory cell array blocks MA10', MA11' share common select lines WL1', WL2' . . . WLn'. A single select line decoder DCR1 services the select lines WL1, WL2 . . . WLn shared by the leftmost memory cell array blocks MA11, MA10, and optionally, the same single select line decoder DCR1 services the select lines WL1', WL2' . . . WLn' shared by the rightmost memory cell array blocks MA10', MA11'. Also, in this embodiment, neighboring memory cell array blocks, for example, neighboring memory cell array blocks MA11 and MA10, neighboring memory cell array blocks MA10 and MA10', and neighboring memory cell array blocks MA10' and MA11' share a common first/second current controller CC12, leading to further integration of the resulting device.

Figure 20:
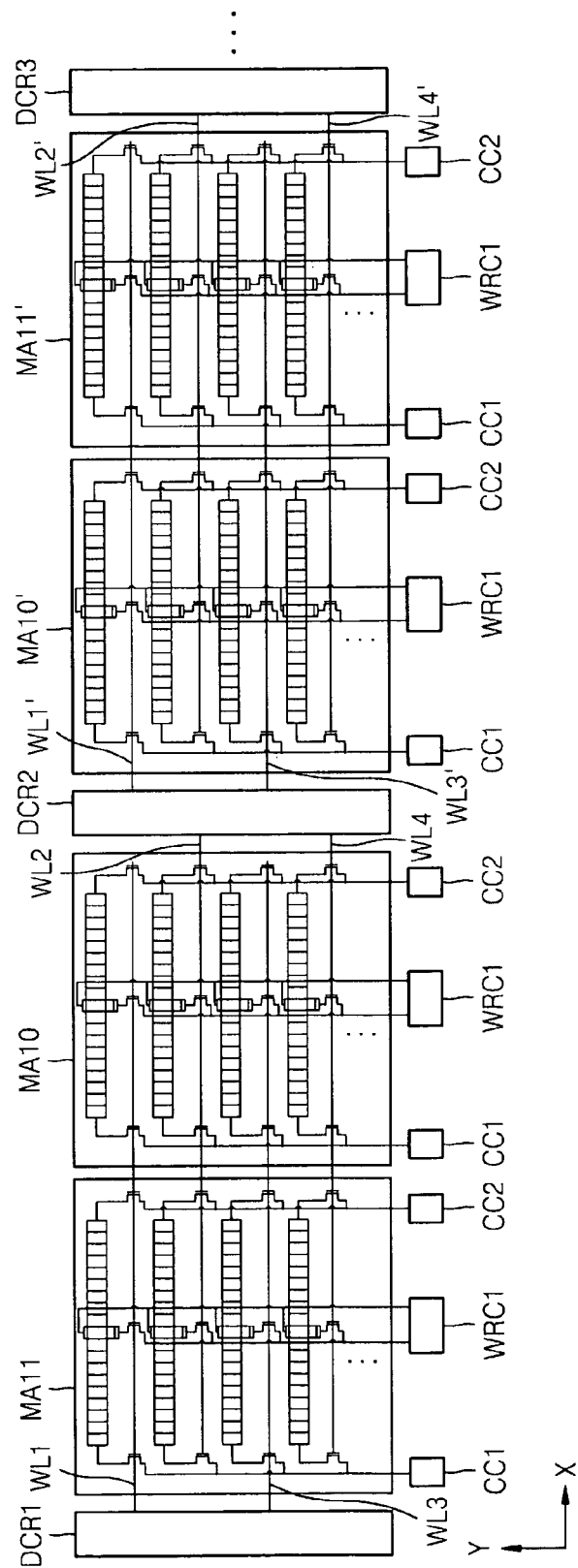

FIG. 20 is a schematic diagram of a memory device employing a plurality of memory blocks with magnetic track storage devices, in accordance with another embodiment of the present inventive concept. In this embodiment, a memory device includes a plurality of memory cell array blocks MA11, MA10, MA10', MA11'. Each memory cell array block MA11, MA10, MA10', MA11' includes an associated first current controller CC1, second current controller CC2, and combined write current/read current controller WRC1. The two leftmost memory cell array blocks MA11, MA10 share common select lines WL1, WL2 . . . WLn, and the two rightmost memory cell array blocks MA10', MA11' share common select lines WL1', WL2' . . . WLn'. A first select line decoder DCR1 services the odd select lines WL1, WL3 shared by the leftmost memory cell array blocks MA11, MA10, a second select line decoder DCR2 services the even select lines WL2, WL4 shared by the leftmost memory cell array blocks MA11, MA10 and services the odd select lines WL1', WL3' shared by the rightmost memory cell array blocks MA10', MA11', and a third select line decoder DCR3 services the even select lines WL2', WL4' shared by the rightmost memory cell array blocks MA10', MA11'.

Figure 21:
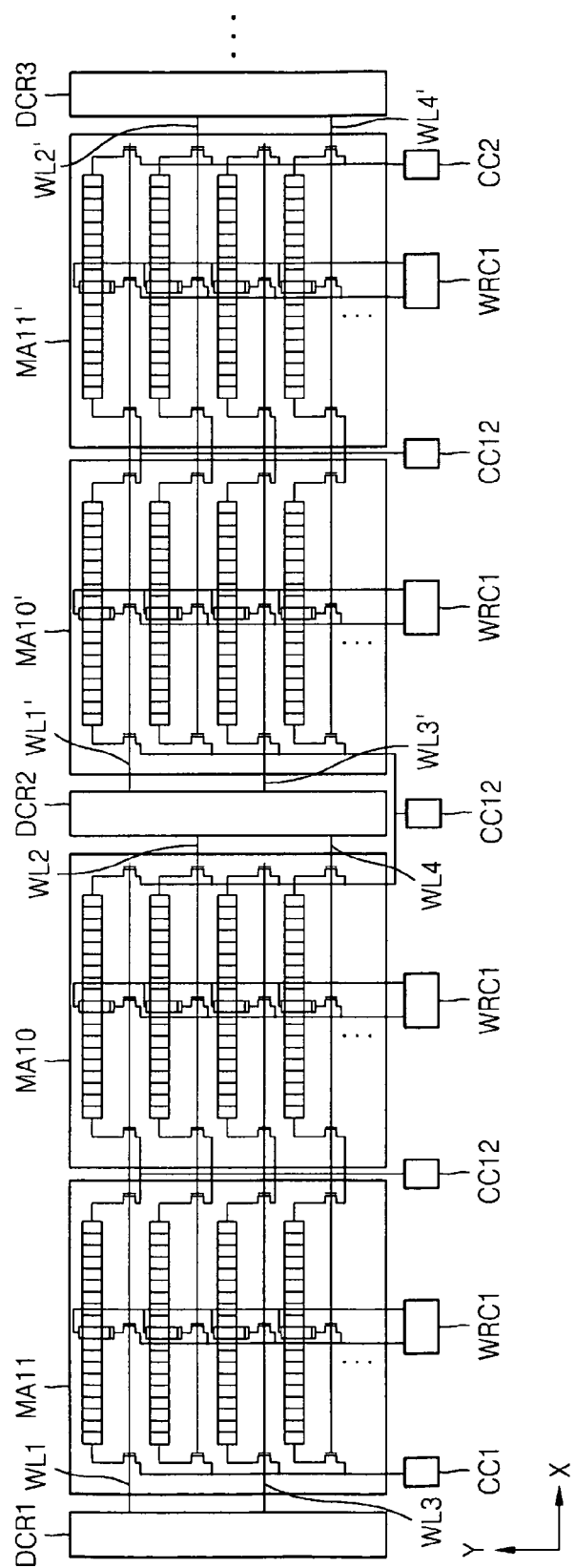

FIG. 21 is a schematic diagram of a memory device employing a plurality of memory blocks with magnetic track storage devices, in accordance with another embodiment of the present inventive concept. In this embodiment, a memory device includes a plurality of memory cell array blocks MA11, MA10, MA10', MA11'. Each memory cell array block MA11, MA10, MA10', MA11' includes an associated combined write current/read current controller WRC1. Like the embodiment of FIG. 20, the two leftmost memory cell array blocks MA11, MA10 share common select lines WL1, WL2 . . . WLn, and the two rightmost memory cell array blocks MA10', MA11' share common select lines WL1', WL2' . . . WLn'. In this embodiment, neighboring memory cell array blocks, for example, neighboring memory cell array blocks MA11 and MA10, neighboring memory cell array blocks MA10 and MA10', and neighboring memory cell array blocks MA10' and MA11' share a common first/second current controller CC12. A first select line decoder DCR1 services the odd select lines WL1, WL3 shared by the leftmost memory cell array blocks MA11, MA10, a second select line decoder DCR2 services the even select lines WL2, WL4 shared by the leftmost memory cell array blocks MA11, MA10 and services the odd select lines WL1', WL3' shared by the rightmost memory cell array blocks MA10', MA11', and a third select line decoder DCR3 services the even select lines WL2', WL4' shared by the rightmost memory cell array blocks MA10', MA11'.

Figure 22:
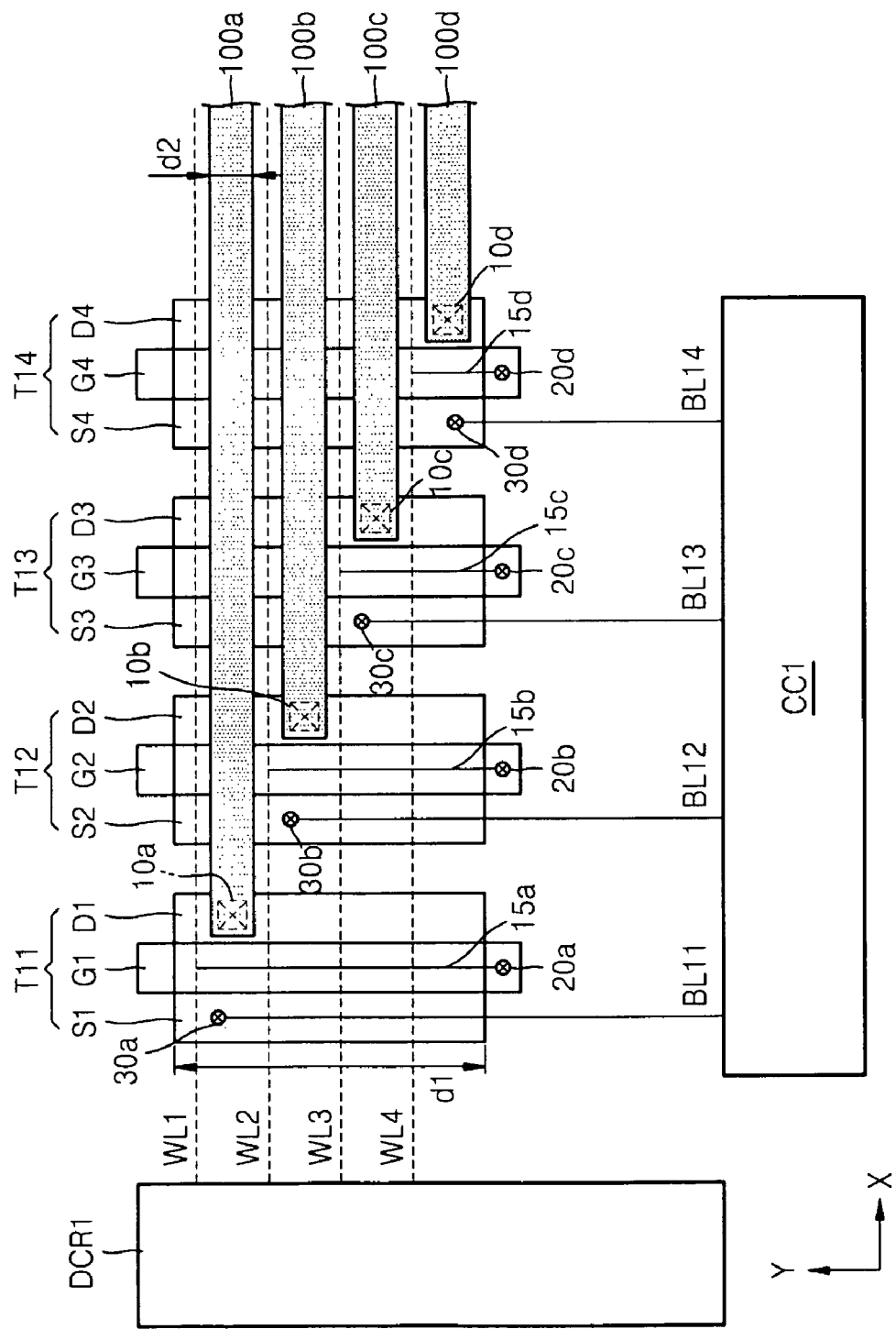
FIG. 22 is a partial layout diagram of a memory device illustrating an advantageous layout of multiple magnetic tracks of the device, in accordance with embodiments of the present invention.

FIG. 22 is a partial layout diagram of a memory device illustrating an advantageous layout of multiple magnetic tracks of the device, in accordance with embodiments of the present inventive concept. In the memory devices and the magnetic track storage devices disclosed herein, the magnitude of the domain wall moving current can be much greater than the magnitude of the write current or read current. As a result, the transistors used for the first switching device and/or the second switching device, for example, transistors T1 or T2 of the FIG. 1 embodiment described above, can be large in size relative to the transistors employed by the select line decoder DCR1. At the same time, for enhanced device integration, it is desired to place the select lines WL1 ... WLn as close together as possible in the Y-axis direction.

Unlike FIG. 22, assuming that the first switching device transistors T11, T12, T13, T14 were positioned to be arranged in the direction of the Y-axis, then a spacing of d1 would be required for the magnetic tracks, in accordance with the height d1 of the first switching device transistors T11, T12, T13, T14 in the direction of the Y-axis; however, as can be seen in FIG. 22, the height of the magnetic tracks 100 in the direction of the Y-axis is only d2. It has therefore been determined to be advantageous to arrange the first switching device transistors T11, T12, T13, T14 in the direction of the X-axis, as shown, while staggering the end positions of the corresponding magnetic tracks 100a, 100b, 100c, 100d.

For example, referring to first switching device transistor T11, the source S1, gate G1 and drain D1 of transistor T11 are arranged in the X-axis direction, as shown. The first select line WL1 is connected to the gate G1 via interconnect metal 15a and conduction plug 20a. The conduction line BL11 is connected from the first current controller CC1 to the source S1 via conduction plug 30a. Also, the leftmost end of the corresponding magnetic track 100a is connected to the drain D1 at the conduction plug 10a.

Similar contact locations are made for the first switching device transistor T12, however, the transistor T12, and its associated contact points, are positioned at a location that is in the same location in a direction along the Y-axis, and is shifted to the right in a direction along the X-axis. In this manner, the end points of the magnetic tracks 100a, 100b, can be said to be staggered in the X-axis direction. Accordingly, the magnetic tracks 100a, 100b themselves can be said to be staggered in the X-axis direction. By staggering the positions of the magnetic tracks 100a, 100b, 100c, 100d in this manner, further integration of the resulting memory device can be achieved.

Figure 23:
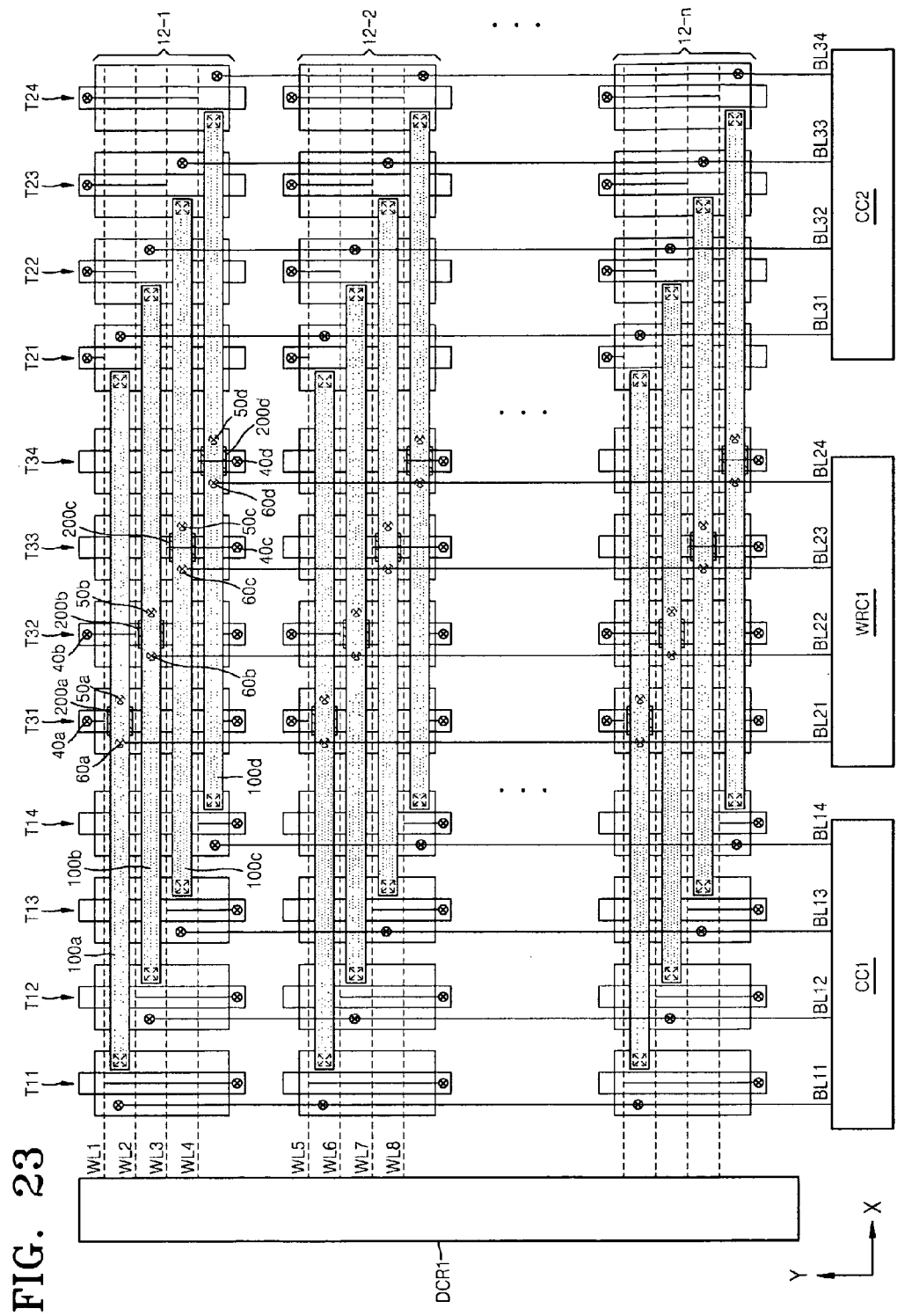
FIG. 23 is a partial layout diagram of a memory device illustrating staggering of the positions of the magnetic tracks in the X-axis direction, in accordance with embodiments of the present invention.

FIG. 23 is a partial layout diagram of a memory device illustrating staggering of the positions of the magnetic tracks 100 in the X-axis direction, in accordance with embodiments of the present inventive concept. In FIG. 23, it can be seen that the first switching device transistors T11, T12, T13, and T14 are arranged in the X-axis direction, as described above in connection with FIG. 20. It can also be seen that the second switching device transistors T21, T22, T23, and T24 are likewise arranged in the X-axis direction. Also, it can be seen that the corresponding magnetic tracks 100a, 100b, 100c, 100d are staggered in the X-axis direction between the respective first switching device transistors T11, T12, T13, and T14 and the respective second switching device transistors T21, T22, T23, and T24. The first switching device transistors T11, T12, T13, and T14 are coupled to a first current controller CC1 and the second switching device transistors T21, T22, T23, and T24 are coupled to a second current controller CC2. The present embodiment employs buffered-type magnetic track storage devices 12-1, 12-2, 12-n; therefore, the shared read/write units 200a, 200b, 200c, 200d are likewise staggered in the X-axis direction at positions that correspond with the staggered magnetic tracks 100a, 100b, 100c, 100d. The shared read/write units 200a, 200b, 200c, 200d are serviced by a combined write current/read current controller WRC1 as described above in connection with FIG. 13.

Switching device transistors T31, T32, T33, T34 control the application of read/write current to the read/write units 200a, 200b, 200c, 200d. Referring to transistor T31, the source, gate and drain of transistor T31 are arranged in the X-axis direction, as shown. The first select line WL1 is connected to the gate G1 via interconnect metal and conduction plug 40a. The conduction line BL21 is connected from the first current controller CC1 to the source S1 via conduction plug 60a. Also, the central portion of the corresponding magnetic track 100a is connected to the drain at the conduction plug 50a. Similar contact locations are made for the other third switching device transistors T32, however, the transistor T32, and its associated contact points, are positioned at a location that is in the same location along the Y-axis, and is shifted to the right along the X-axis. In this manner, the read/write units 200a, 200b, 200c, 200d corresponding to the magnetic tracks 100a, 100b, 100c, 100d can be said to be staggered in the X-axis direction.

Similar arrangements are made for the other magnetic track storage devices 12-1, 12-2, 12-n in the memory device illustrated in FIG. 23.

Figure 24:
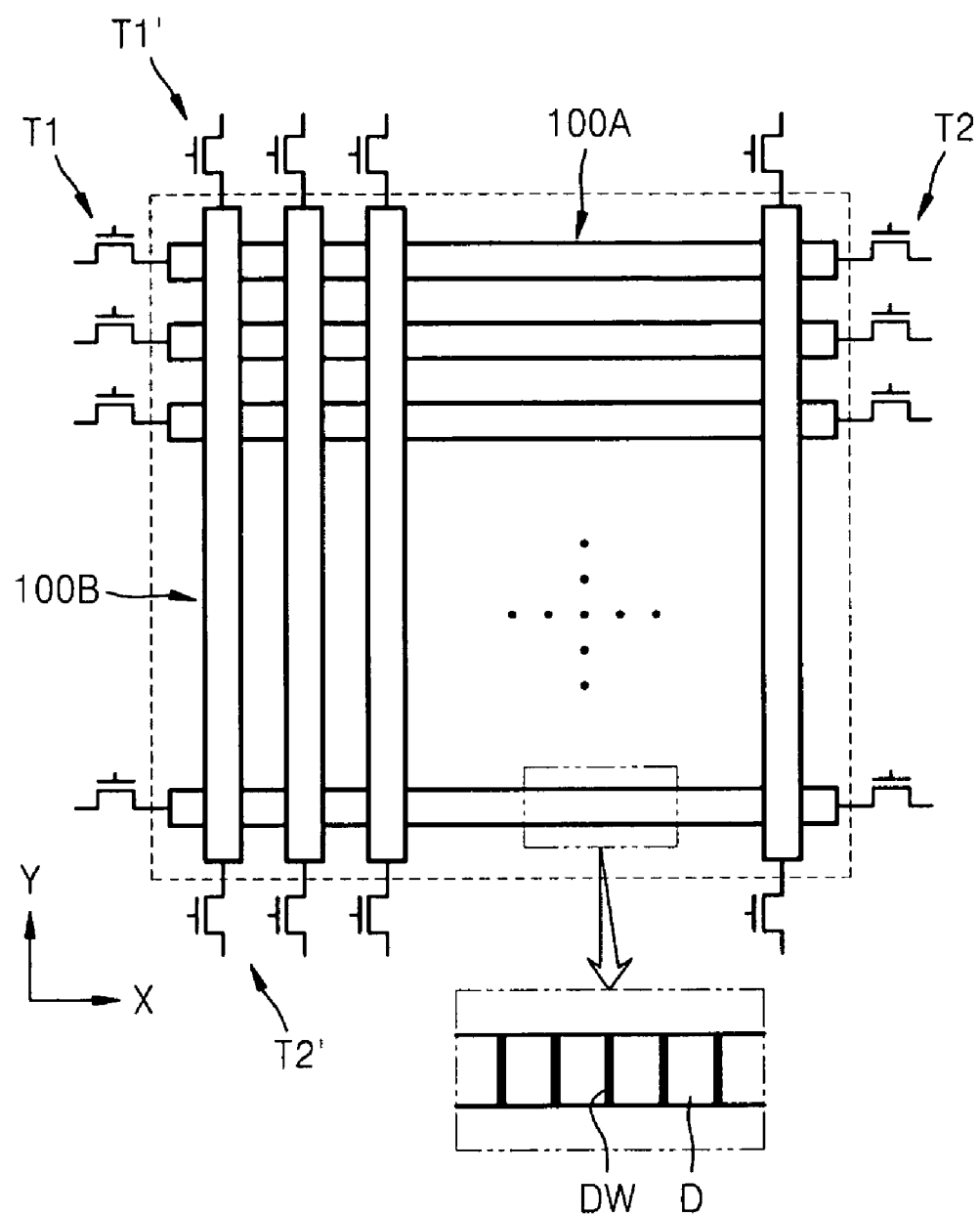
FIGS. 24, 25, and 27 are conceptual layout diagrams of memory devices illustrating stacking of magnetic tracks, in accordance with embodiments of the present invention.

FIG. 24 is a conceptual layout diagram of a memory device illustrating stacking of magnetic tracks, in accordance with embodiments of the present inventive concept. In this example, a first layer of the memory device includes a plurality of first magnetic tracks 100A extending in the X-axis direction. The plurality of first magnetic tracks 100A are each serviced by a first switching device T1 and a second switching device T2 used for generating the domain wall moving current for the respective first magnetic tracks 100A. Also, a second layer of the memory device includes a plurality of second magnetic tracks 100B extending in the Y-axis direction. The plurality of second magnetic tracks 100B are each serviced by a first switching device T1' and a second switching device T2' used for generating the domain wall moving current for the respective second magnetic tracks 100B. By displacing the respective positions of the first switching device T1 of the first layer and the first switching device T1' of the second layer by 90 degrees, and by displacing the respective positions of the second switching device T2 of the first layer and the second switching device T2' of the second layer by 90 degrees, higher density integration can be achieved in the resulting device.

Since, in the current embodiment, the first magnetic tracks 100A and the second magnetic tracks 100B extend in different directions, the first and second switching devices T1 and T2, and the third and fourth switching devices T1' and T2' can be formed at different locations. In one embodiment, the first to fourth switching devices T1, T2, T1', and T2' can be formed on a common substrate, or can be formed at different locations on the same substrate. In this manner, placement of the first to fourth switching devices T1, T2, T1', and T2' can be made easier, and also the integration degree of the resulting information storage device can be enhanced. In a case where the first and second magnetic tracks 100A and 100B extend in the same direction, then the third switching device T1' should be installed between the first switching devices T1 and the fourth switching device T2' should be installed between the second switching devices T2. In this case, the distances between the first magnetic tracks 100A and between the second magnetic tracks 100B can increase, thereby hindering further integration of the information storage device. However, since, in the current embodiment, the first magnetic tracks 100A are arranged in a different direction than the second magnetic tracks 100B as described above, the first and second switching devices T1 and T2, and the third and fourth switching devices T1' and T2' can be formed at different locations, and the first magnetic tracks 100A and the second magnetic tracks 100B can be arranged with greater density.

Although not shown in FIG. 24, each of the first magnetic tracks 100A can be configured to include a write unit and a read unit or, optionally, can be configured to include a write/read unit in which the write unit and the read unit are combined in a single body. Similarly, each of the second magnetic tracks 100B can include a write unit and a read unit or can include a write/read unit in which the write unit and the read unit are combined in a single body. The write unit can comprise a device that writes information by using a spin transfer torque. For example, the write unit can comprise a tunnel magneto resistance (TMR) device or a giant magneto resistance (GMR) device. The read unit can comprise a sensor that reads information by using the TMR or GMR effect. The write/read unit can comprise a single device that writes information based on the principles of the write unit and reads information based on the principles of the read unit. The structure and operation of the write/read unit would be apparent to those of ordinary skill in the art and will therefore not be described in further detail herein. The write unit and the read unit can be separately located at both ends of each of the first and second magnetic tracks 100A and 100B or can optionally be located in a middle portion of each of the first and second magnetic tracks 100A and 100B, and, optionally, adjacent each other in the middle portion. In another embodiment, the write unit and the read unit can be located at the same end of each of the first and second magnetic tracks 100A and 100B, for example, adjacent to each other. In other embodiments, the combined write/read unit can be located on a center part of or at one end of each of the first and second magnetic tracks 100A and 100B so that they are adjacent to each other. The structures and locations of the write unit, the read unit, and the write/read unit are not limited by the above description and can be arranged in any of a number of suitable configurations. In another embodiment, at least one switching device (not shown) can be provided, configured for controlling signal access to the write unit, the read unit, or the write/read unit.

Figure 25:
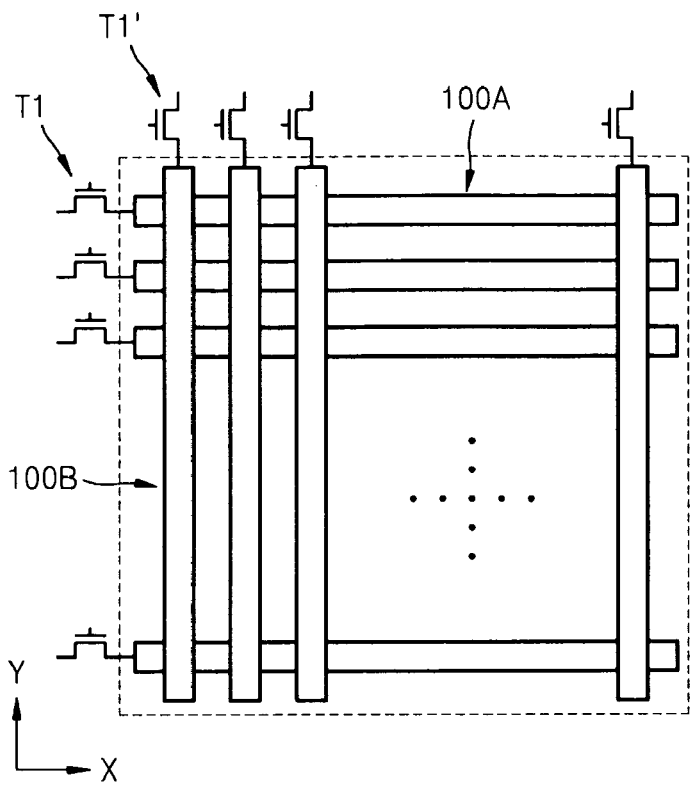

FIG. 25 is a conceptual cross-sectional diagram of a memory device illustrating stacking of magnetic tracks, in accordance with another embodiment of the present inventive concept. This embodiment is similar in configuration to that of FIG. 24. An exception lies in that in the present embodiment, the second switching devices T2, T2' are not employed in the current path for applying the domain wall moving current to the magnetic tracks.

Figure 26:
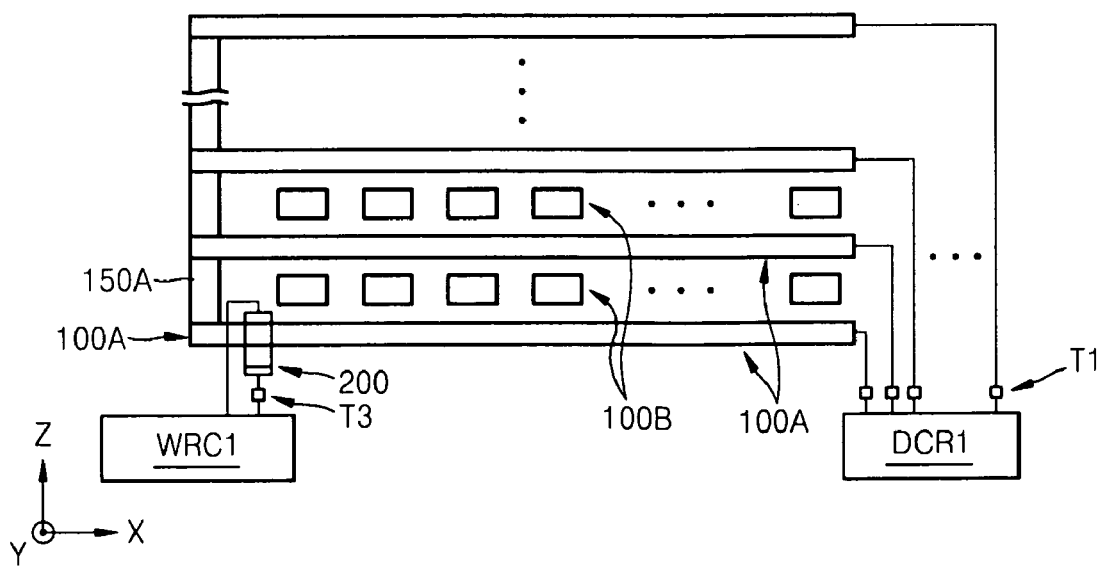
FIGS. 26, 28, and 29 are conceptual side view diagrams of memory devices illustrating stacking of magnetic tracks, in accordance with other embodiments of the present invention.

FIG. 26 is a conceptual cross-sectional diagram of a memory device illustrating stacking of magnetic tracks, in accordance with another embodiment of the present inventive concept. In this embodiment, first magnetic tracks 100A on different layers are connected by a vertical interconnect plug 150A of soft magnet material, such as materials including at least one of Ni, Co, NiCo, NiFe, CoFe, CoZrNb, and CoZrNr, or of ferromagnetic material such as materials including at least one of Co, Ni, and Fe. Also, second magnetic tracks 100B on different layers can be connected by a vertical interconnect plug (not shown). In this arrangement, the first layer of the first magnetic track 100A, and the first layer of the second magnetic track 100B can be used as a buffer layer during a read operation, and the upper layers of the first magnetic tracks 100A and the second magnetic tracks 100B can be used as data layers. Since a buffered arrangement is used, shared read/write units 200 are required only on the first, buffer layer, and data is transported to and from the buffer layers via the interconnect plugs 150A. A decoder unit DCR1 services the magnetic tracks of the various layers.

Referring to FIG. 26, a plurality of the first magnetic tracks 100A extending in the X-axis direction and a plurality of the second magnetic tracks 100B extending in the Y-axis direction can be alternately and repeatedly stacked. Although FIG. 26 illustrates only one of the first magnetic tracks 100A on the same layer since the figure is a cross-section, the plurality of the first magnetic tracks 100A can be formed on the same layer.

The first magnetic tracks 100A that are disposed in the same vertical line, i.e., that belong to the same column, can be connected to one another, among the plurality of the stacked first magnetic tracks 100A. In this case, the vertical interconnect plug 150A can be disposed between one end of the first magnetic track 100A belonging to an $N^{th}$ layer and one end of the first magnetic track 100A belonging to an $N+1^{th}$ layer. The vertical interconnect plug 150A can be a ferromagnetic layer that is the same as the first magnetic tracks 100A or can be a soft magnetic layer, the magnetic anisotropic energy of which is lower than those of the first magnetic tracks 100A. The soft magnetic layer may be formed of, for example, a material selected from the group consisting of Ni, Co, NiCo, NiFe, CoFe, CoZrNb, and CoZrCr. Referring to FIG. 26, first ends of two first magnetic tracks 100A adjacent to upper and lower surfaces of the vertical interconnect plug 150A can be arranged to contact each other, but in some cases, two first magnetic tracks 100A adjacent to both sides of the vertical interconnect layer 150A may be in contact with each other. Domains and domain walls of one of the first magnetic tracks 100A can be moved to another first magnetic track 100A via the vertical interconnect plug 150A. For example, the domains and domain walls of the first magnetic track 100A on the first layer can be moved to the first magnetic track 100A on a third layer or can be moved opposite to the first magnetic track 100A on the third layer. Although not shown in FIG. 26, the second magnetic track 100B belonging to the same column can be connected among the plurality of the stacked second magnetic tracks 100B. For example, another vertical interconnect plug (not shown) can be disposed between one end of the second magnetic track 100B on the $N^{th}$ layer and one end of the second magnetic track 100B on the $N+1^{th}$ layer. The other vertical interconnect plug can be the same as the vertical interconnect plug 150A.

A first switching device T1 can be connected to a second end of each of the first magnetic tracks 100A, and a first decoder unit DCR1 can be connected to each of the first switching devices T1. In a case where the first switching devices T1 are transistors, gates of the first switching devices T1 can be connected to the first decoder unit DCR1, respectively. A source or drain of each of the first switching devices T1, e.g., the source, can be connected to the corresponding first magnetic track 100A, and the other, e.g., the drain, can be connected to a predetermined current controller (first current controller) (not shown). The respective functions of the source and the drain may be reversed. In addition, the drains or sources of the first switching devices T1 connected to the first magnetic tracks 100A other than the first magnetic track 100A belonging to the first layer can be connected to the first current controller via the same wire from among the plurality of the stacked first magnetic tracks 100A. Although not shown, additional switching devices can be connected to second ends of the plurality of the second magnetic track 100B. The additional switching devices can be connected to an additional decoder unit DCR2 illustrated in FIG. 27 and another current controller (second current controller).

A first write/read unit 200 can be disposed on each of the first magnetic tracks 100A belonging to the first layer from among the plurality of the first magnetic tracks 100A. The first write/read unit 200 can be disposed adjacent one end of each of the first magnetic tracks 100A belonging to the first layer. If the first magnetic track 100A is connected to a side surface of the vertical interconnect plug 150A, then the first write/read unit 200 can be disposed at one end of the first magnetic track 100A. A first write current/read current controller WRC1 can be connected to the plurality of the first write/read units 200. The first write current/read current controller WRC1 can include a write current controller and a sense circuit. At least one switching device T3 can be disposed between the first write/read unit 200 and the first write current/read current controller WRC1. Although FIG. 26 illustrates a case where the switching device T3 is disposed only between a bottom surface, e.g., one end, of the first write/read unit 200 and the first write current/read current controller WRC1, an additional switching device can optionally be disposed between a top surface, e.g., the other end, of the first write/read unit 200 and the first write current/read current controller WRC1. In this case, the switching device T3 is not disposed between the bottom surface, e.g., one end, of the first write/read unit 200 and the first write current/read current controller WRC1. A write operation and a read operation performed using the first write/read unit 200 can be controlled by the first write current/read current controller WRC1.

Although not shown, a second write/read unit can be disposed on each of the second magnetic tracks 100B belonging to the first layer from among the plurality of the stacked second magnetic track 100B. The second write/read unit can be disposed adjacent to one end of each of the second magnetic tracks 100B belonging to the first layer. Also, a second write current/read current controller WCR2 illustrated in FIG. 27 can be connected to a plurality of the second write/read unit, and at least one switching device can be disposed between each of the second write/read unit and the second write current/read current device WCR2.

The first magnetic tracks 100A belonging to the first layer from among the stacked first magnetic tracks 100A, and the second magnetic tracks 100B belonging to the first layer from among the stacked second magnetic tracks 100B can be used as buffer regions for temporarily storing information. The other first and second magnetic tracks 100A and 100B can be configured to operate as effective storage regions.

Figure 27:
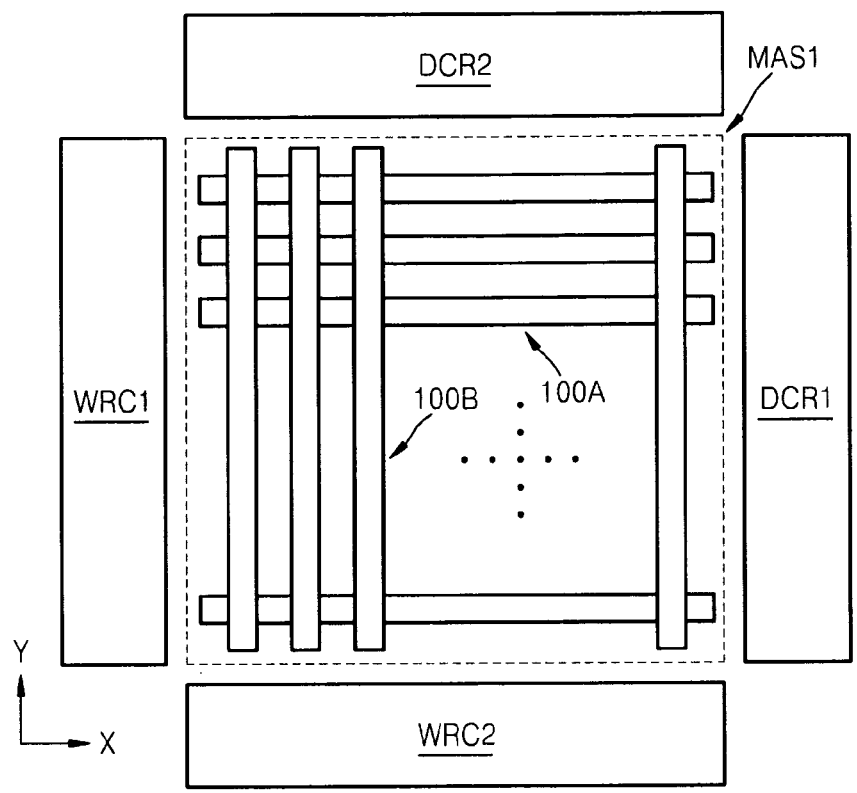

FIG. 27 is a conceptual layout diagram of a memory device illustrating stacking of magnetic tracks, in accordance with another embodiment of the present inventive concept. This embodiment is similar in configuration to that of FIGS. 24 and 25. In this embodiment however, it is shown that a first decoder unit DCR1 and a first combined write current/read current controller WRC1 service the first magnetic tracks 100A of the first layer and a second decoder unit DCR2 and a second combined write current/read current controller WRC2 service the second magnetic tracks 100B of the second layer of the first memory array block MAS1. Additional memory array blocks MASn, and corresponding first and second magnetic tracks with first and second combined write current/read current controllers WRCn and first and second decoder units DCRn, can be stacked above the first memory array block MAS1.

Figure 28:
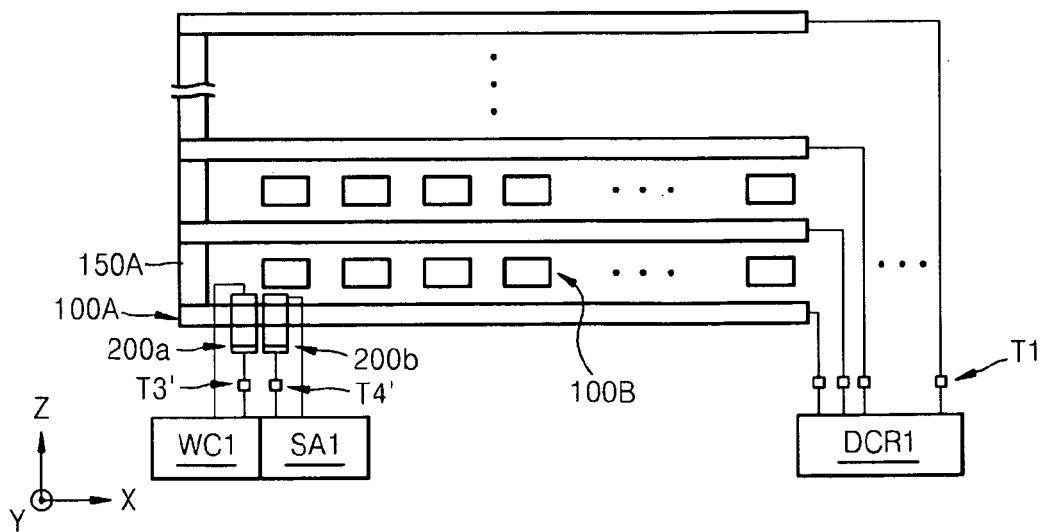

FIG. 28 is a conceptual side view diagram of a memory device illustrating stacking of magnetic tracks, in accordance with another embodiment of the present inventive concept. This embodiment is similar to the embodiment shown and described above in connection with FIG. 26. In the present embodiment, however, separated write units 200a and read units 200b, with corresponding write current controllers WC1 and sense amplifier controllers SA1 are employed.

Figure 29:
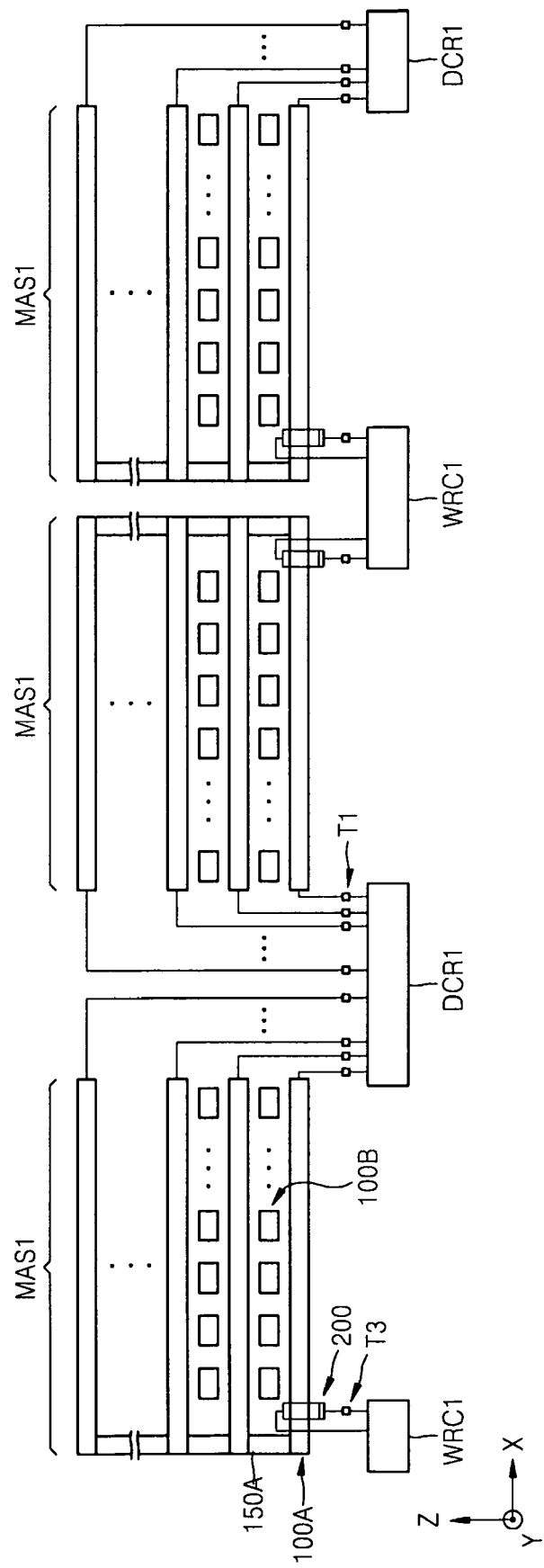

FIG. 29 is a conceptual side view diagram of a memory device illustrating stacking of magnetic tracks, in accordance with another embodiment of the present inventive concept. This embodiment is similar to the embodiment shown and described above in connection with FIG. 26, except that the present embodiment further illustrates that stacked memory array blocks MAS1 can be distributed in the direction along the X-axis, and neighboring stacked memory array blocks MAS1 can share a common combined first and second write current/read current controllers WRC1 and first and second decoder units DCRn.

Figure 30:
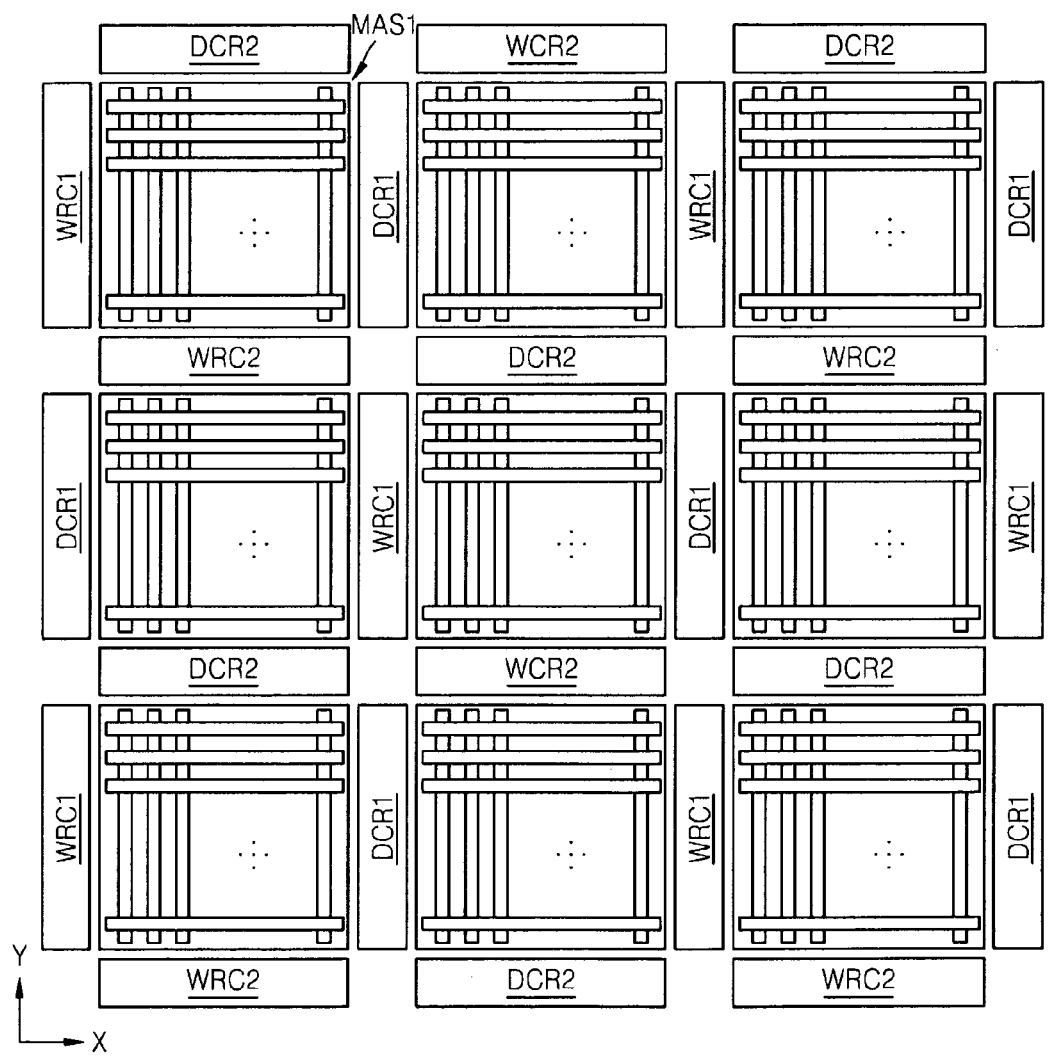
FIG. 30 is a conceptual top layout diagram of a memory device illustrating stacking of magnetic tracks, in accordance with another embodiment of the present invention.

FIG. 30 is a conceptual top layout diagram of a memory device illustrating stacking of magnetic tracks, in accordance with another embodiment of the present inventive concept. This embodiment is similar to the embodiment shown and described above in connection with FIG. 29, except that the present embodiment further illustrates that a two-dimensional array of stacked memory array blocks MAS1, extending along both the X and Y axes, can further be distributed in the direction along the X-axis, and neighboring stacked memory array blocks MAS1 can share a common, combined first and second write current/read current controllers WRC1 and first and second decoder units DCRn.

Figure 31:
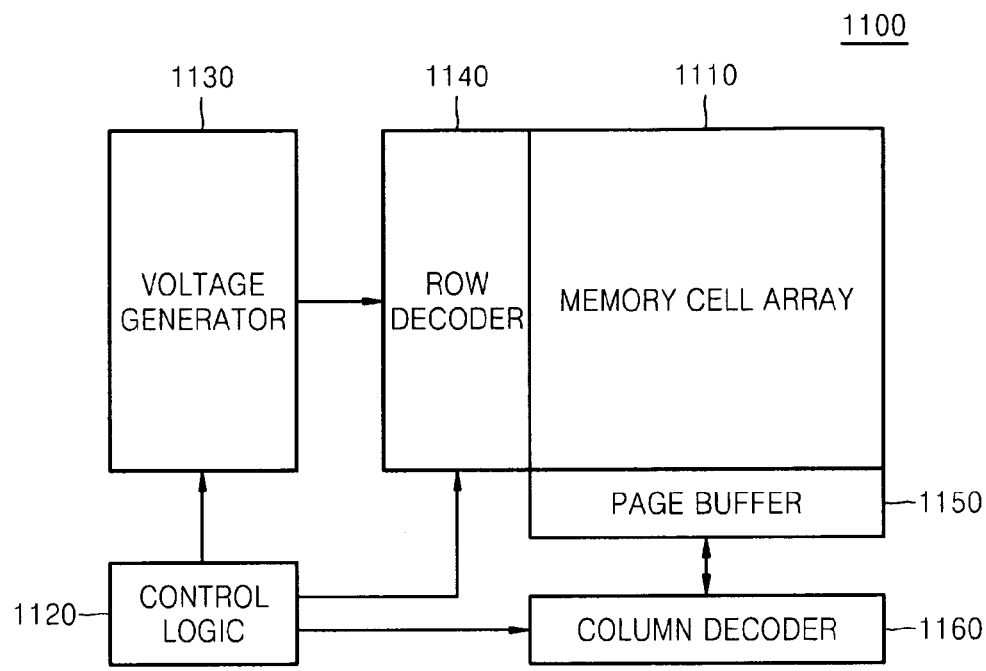
FIG. 31 is a block diagram of a memory device in accordance with embodiments of the present invention.

FIG. 31 is a block diagram of a memory device in accordance with embodiments of the present inventive concept. A memory device 1100 includes a memory cell array 1110, control logic 1120, a voltage generator 1130, a row decoder 1140, a page buffer 1150, and a column decoder 1160. The memory cell array 1110 includes a plurality of magnetic track storage devices of the type described herein, optionally arranged in memory blocks. Control logic 1120 transmits control signals to the voltage generator 1130, the row decoder 1140 and the column decoder 1160 in accordance with the operation to be performed, for example, erase, programming, and read operations. The voltage generator 1130 generates the voltages required for performing the device operations. The row decoder 1140 determines the manner in which the voltage signals provided by the voltage generator are applied to the select lines of the memory cell array 1110. The column decoder determines which signals of the conduction lines BLn of the device read by the page buffer 1150 are to be used in determining data values that are read, or determines voltages that are applied to the conduction lines BLn during programming and erase operations.

Figure 32:
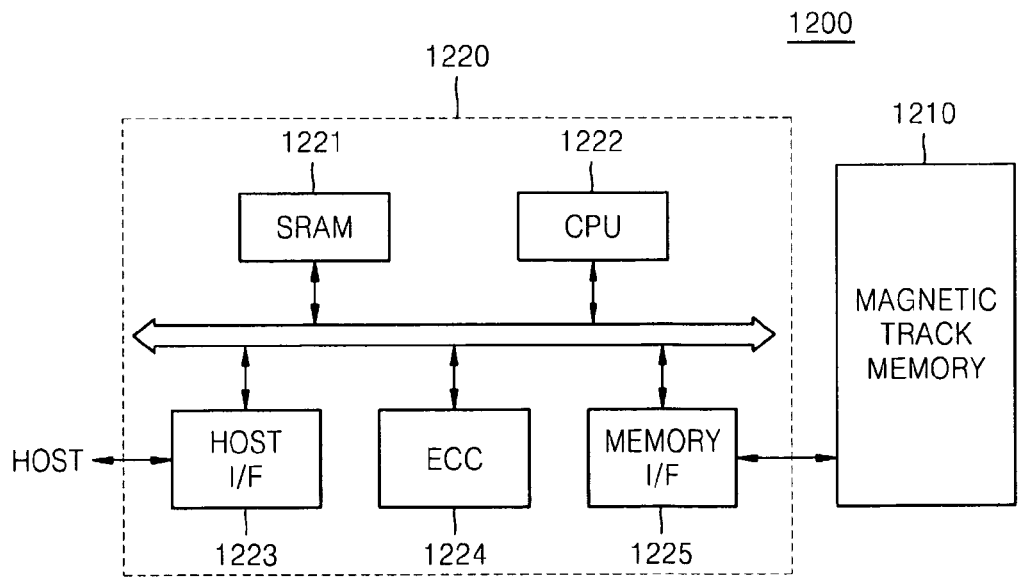
FIG. 32 is a block diagram of a memory card that includes a semiconductor device in accordance with the embodiments of the present invention.

FIG. 32 is a block diagram of a memory card that includes a semiconductor device in accordance with the embodiments of the present inventive concept. The memory card 1200 includes a memory controller 1220 that generates command and address signals C/A and a memory module 1210 that includes one or a plurality of memory devices incorporating magnetic track storage devices of the type described herein. The memory controller 1220 includes a host interface 1223 that transmits and receives command and address signals to and from a host, a controller 1224, and a memory interface 1225 that in turn transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device includes a plurality of addressable magnetic tracks and a decoder that receives the receives the command and address signals, and that generates a row signal and a column signal for accessing at least one of the addressable locations on the magnetic tracks during programming and read operations.

Each of the components of the memory card 1200, including the memory controller 1220, electronics 1221, 1222, 1223, 1224, and 1225 included on the memory controller 1220 and the memory module 1210 can employ memory devices including magnetic track storage devices configured according to the inventive concepts disclosed herein.

Figure 33:
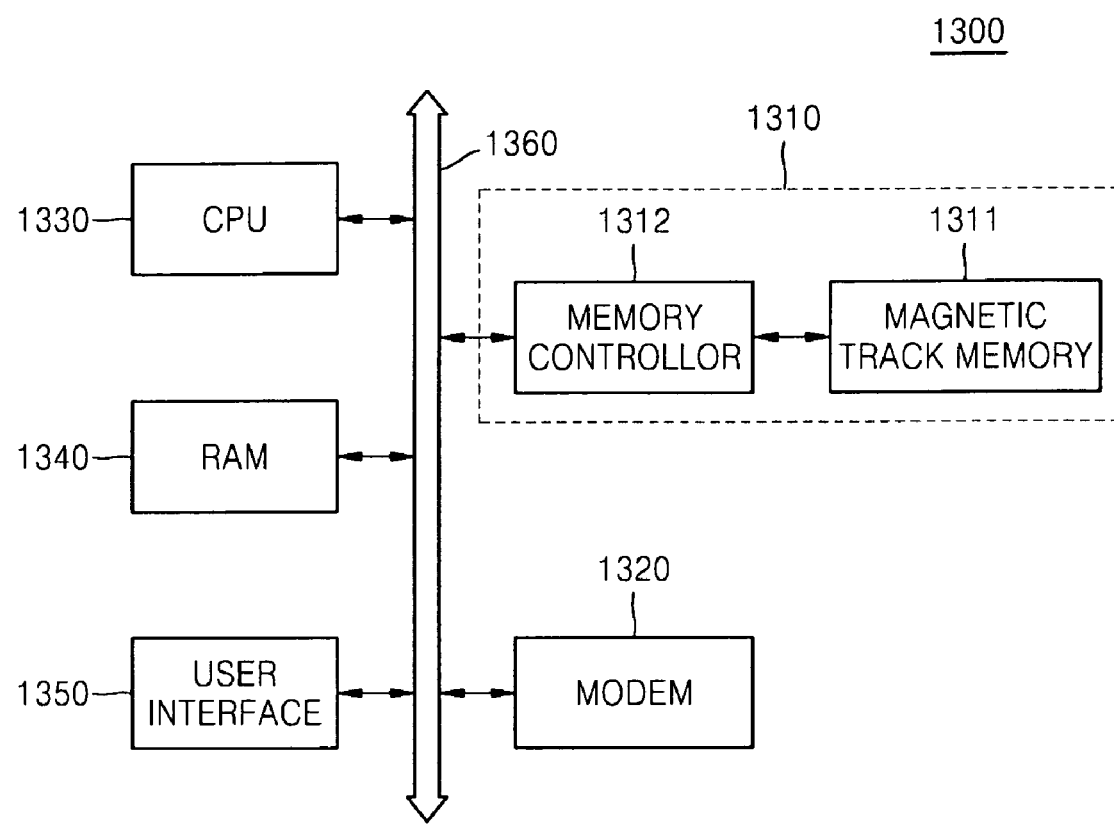
FIG. 33 is a block diagram of a memory system that employs a memory module, for example, of the type described herein, in accordance with the embodiments of the present invention.

FIG. 33 is a block diagram of a memory system 1300 that employs a memory module 1310, for example, of the type described herein, in accordance with the embodiments of the present inventive concept. The memory system 1300 includes a processor 1330, random access memory 1340, user interface 1350 and modem 1320 that communicate via a common bus 1360. The devices on the bus 1360 transmit signals to and receive signals from the memory card 1310 via the bus 1360. Each of the components of the memory system 1300, including the processor 1330, random access memory 1340, user interface 1350 and modem 1320 along with the memory card 1310 can employ memory devices including magnetic track storage devices of the type disclosed herein. The memory system 1300 can find application in any of a number of electronic applications, for example, those found in consumer electronic devices such as solid state disks (SSD), camera image sensors (CIS) and computer application chip sets.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

While embodiments of the inventive concept have been particularly shown and described with references to preferred embodiments thereof, it will be understood by those skilled in the art that various changes in form and details may be made herein without departing from the spirit and scope of the invention as defined by the appended claims.

What is claimed is:

1. A memory device, comprising:
    a magnetic structure that stores information in a plurality of domains of the magnetic structure;
    a write unit that writes information to at least one of the plurality of domains of the magnetic structure by applying a write current to the magnetic structure in response to a control signal;
    a read unit that reads information from at least one of the plurality of domains of the magnetic structure by applying a read current to the magnetic structure in response to the control signal; and
    a domain wall movement control unit coupled to a portion of the magnetic structure that moves information stored in the plurality of domains in the magnetic structure to other domains in the magnetic structure in response to the control signal; and
    wherein the write unit, the read unit and the domain wall movement control unit are all coupled to the same control signal line that provides the control signal.

2. The memory device of claim 1 wherein the write unit comprises at least one write control switch that controls the application of a write current to the at least one of a plurality of domains of the magnetic structure in response to the control signal, and wherein a gate of the at least one write control switch is coupled to the control signal line.

3. The memory device of claim 1 wherein the read unit comprises at least one read control switch that controls the application of a read current to the at least one of a plurality of domains of the magnetic structure in response to the control signal, and wherein a gate of the at least one read control switch is coupled to the control signal line.

4. The memory device of claim 1 wherein the domain wall movement control unit comprises at least one domain wall movement control switch that controls the application of a domain wall movement current to the magnetic structure in response to the control signal, and wherein a gate of the domain wall movement control switch is coupled to the control signal line.

5. The memory device of claim 4 wherein the at least one domain wall movement unit is connected to first and second portions of the magnetic structure that are spaced apart from each other so that the domain wall current is applied through the magnetic structure in response to the control signal.

6. The memory device of claim 4 wherein the at least one domain wall movement unit comprises at least one domain wall movement control switch that is connected to one of the first and second portions of the magnetic structure and wherein the other of the first and second portion of the magnetic structure is directly connected to a potential supply.

7. The memory device of claim 4 wherein the at least one domain wall movement unit comprises first and second domain wall movement control switches that are respectively connected to the first and second portions of the magnetic structure.

8. The memory device of claim 1 wherein the write unit and read unit are coupled to portions of the magnetic structure that are spaced apart from each other so that they write information to and read information from respectively different domains of the plurality of domains of the magnetic structure.

9. The memory device of claim 8 wherein the write unit and read unit are coupled to portions of the magnetic structure that are at opposite ends of the magnetic structure.

10. The memory device of claim 1 wherein the write unit and read unit are coupled to portions of the magnetic structure that are the same so that they write information to and read information from a same domain of the plurality of domains of the magnetic structure.

11. The memory device of claim 10 wherein the portions of the magnetic structure to which the write unit and read unit are coupled are at a central region of magnetic structure.

12. A memory device comprising:
    a memory decoder that generates a plurality of select signals in response to command and address signals received from a memory controller and that applies the select signals to selected signal lines;
    a domain wall movement current generator that applies a domain wall movement current to a domain wall movement current signal line;
    a write current generator that applies a write current to a write current signal line;
    a read current generator that applies a read current to a read current signal line; and
    a plurality of storage units, each storage unit comprising:
        a magnetic structure that stores information in a plurality of domains of the magnetic structure;
        a write unit that writes information to at least one of the plurality of domains of the magnetic structure by applying the write current to the magnetic structure in response to the select signal on the corresponding selected signal line;
        a read unit that reads information from at least one of the plurality of domains of the magnetic structure by applying a read current to the magnetic structure in response to the select signal on the corresponding selected signal line; and
        a domain wall movement control unit coupled to a portion of the magnetic structure that moves information stored in the plurality of domains in the magnetic structure to other domains in the magnetic structure in response to the select signal on the corresponding selected signal line.

13. The memory device of claim 12, wherein the write unit, the read unit and the domain wall movement control unit of each storage unit are all coupled to the same select signal line that provides the select signal.

14. The memory device of claim 12 wherein:
   each storage unit selectively receives one of the plurality of select signals from the memory decoder on a corresponding one of the select signal lines;
   each storage unit selectively receives the domain wall movement current on the domain wall movement current signal line;
   each storage unit selectively receives the write current on the write current signal line; and
   each storage unit selectively receives the read current on the read current signal line.

15. The memory device of claim 12 wherein the domain wall movement current generator is directly coupled to at least one end of the magnetic structure of a plurality of the storage units.

16. The memory device of claim 12 wherein the select signal lines extend in a first horizontal direction and wherein the domain wall movement current signal line extends in a second horizontal direction that is transverse the first horizontal direction.

17. The memory device of claim 12 wherein the select signal lines and the domain wall movement current signal line are spaced apart from each other in a vertical direction.

18. The memory device of claim 12 incorporated into a memory system, the memory system further comprising:
   a memory controller that generates command and address signals; and
   a memory module comprising a plurality of the memory devices, the memory module receiving the command and address signals and in response storing and retrieving data to and from at least one of the memory devices.

19. A multiple-layered memory device comprising:
   a plurality of storage units on first and second layers of the memory device, each storage unit comprising:
      a magnetic structure that stores information in a plurality of domains of the magnetic structure;
      a write unit that writes information to at least one of the plurality of domains of the magnetic structure by applying the write current to the magnetic structure in response to the select signal on the corresponding select signal line;
      a read unit that reads information from at least one of the plurality of domains of the magnetic structure by applying a read current to the magnetic structure in response to the select signal on the corresponding select signal line;
      a domain wall movement control unit coupled to a portion of the magnetic structure that moves information stored in the plurality of domains in the magnetic structure to other domains in the magnetic structure in response to the select signal on the corresponding select signal line; and
      wherein the write unit, the read unit and the domain wall movement control unit are all coupled to the same select signal line that provides the select signal;
   wherein the magnetic structures of the storage units on the first layer of the memory device are oriented to extend in a first horizontal direction, and wherein the magnetic structures of the storage units on the second layer of the memory device are oriented to extend in a second horizontal direction, the second horizontal direction being transverse the first horizontal direction.

20. The multiple-layered memory device of claim 19 wherein the first horizontal direction and the second horizontal direction are perpendicular.

21. The multiple-layered memory device of claim 19 further comprising:
   a memory decoder that generates a plurality of select signals in response to command and address signals received from a memory controller and that applies the select signals to select signal lines;
   a domain wall movement current generator that applies a domain wall movement current to a domain wall movement current signal line;
   a write current generator that applies a write current to a write current signal line; and
   a read current generator that applies a read current to a read current signal line;
   wherein:
      each storage unit selectively receives one of the plurality of select signals from the memory decoder on a corresponding one of the select signal lines;
      each storage unit selectively receives the domain wall movement current on the domain wall movement current signal line;
      each storage unit selectively receives the write current on the write current signal line; and
      each storage unit selectively receives the read current on the read current signal line.

* * * * *